US012813082B2

(12) United States Patent
Park et al.

(10) Patent No.: US 12,813,082 B2
(45) Date of Patent: Nov. 24, 2026

(54) DISPLAY DEVICE AND METHOD FOR PROVIDING THE SAME

(71) Applicant: Samsung Display Co., LTD., Yongin-si (KR)

(72) Inventors: Joon Yong Park, Yongin-si (KR); Hyun Eok Shin, Yongin-si (KR); Su Kyoung Yang, Yongin-si (KR); Dong Min Lee, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 338 days.

(21) Appl. No.: 18/410,134

(22) Filed: Jan. 11, 2024

(65) Prior Publication Data

US 2024/0389394 A1 Nov. 21, 2024

(30) Foreign Application Priority Data

May 16, 2023 (KR) ........................ 10-2023-0062788

(51) Int. Cl.
*H10K 59/122* (2023.01)
*H10K 59/12* (2023.01)
(Continued)

(52) U.S. Cl.
CPC ....... *H10K 59/122* (2023.02); *H10K 59/1201* (2023.02); *H10K 59/126* (2023.02);
(Continued)

(58) Field of Classification Search
CPC ............. H10K 59/122; H10K 59/1201; H10K 59/126; H10K 59/38; H10K 59/40;
(Continued)

(56) References Cited

U.S. PATENT DOCUMENTS 11,348,983 B1 5/2022 Choung
2022/0077257 A1 3/2022 Choung et al.
(Continued)

FOREIGN PATENT DOCUMENTS

JP 2008135325 A 6/2008
KR 20120075040 A 7/2012
KR 20240079216 A 6/2024

*Primary Examiner* — Allison Bernstein

(74) *Attorney, Agent, or Firm* — CANTOR COLBURN LLP

(57) ABSTRACT

A display device includes an emission area including a pixel electrode, an inorganic layer exposing the pixel electrode to outside the inorganic layer, a light emitting layer and a common electrode, and a bank layer on the inorganic layer and in which an opening is defined corresponding to the emission area. The bank layer includes a first bank layer including zinc, a second bank layer on the first bank layer, a third bank layer on the second bank layer, each of the first bank layer, the second bank layer and the third bank layer including a side surface which defines a portion of the opening in the bank layer; the side surface of the first bank layer recessed from the side surface of the second bank layer in a direction away from the first emission area; and the side surface of the second bank layer recessed from the side surface of the first bank layer in a direction away from the emission area.

14 Claims, 18 Drawing Sheets

(51) Int. Cl.

| | |
|---|---|
| ***H10K 59/126*** | (2023.01) |
| ***H10K 59/38*** | (2023.01) |
| ***H10K 59/40*** | (2023.01) |
| ***H10K 71/20*** | (2023.01) |
| ***H10K 71/60*** | (2023.01) |
| ***H10K 102/00*** | (2023.01) |

(52) U.S. Cl.
CPC ............. *H10K 59/38* (2023.02); *H10K 59/40* (2023.02); *H10K 71/231* (2023.02); *H10K 71/60* (2023.02); *H10K 2102/351* (2023.02)

(58) Field of Classification Search
CPC ................. H10K 71/231; H10K 71/60; H10K 2102/351; H10K 71/00; H10K 59/121; H10K 59/8051; H10K 59/8052; G09F 9/335
See application file for complete search history.

(56) References Cited

U.S. PATENT DOCUMENTS

| | | | | |
|---|---|---|---|---|
| 2022/0208943 | A1 | 6/2022 | Aoki et al. | |
| 2024/0114726 | A1* | 4/2024 | Park | H10K 59/122 |
| 2024/0121989 | A1* | 4/2024 | Jung | H10K 59/38 |
| 2024/0122039 | A1* | 4/2024 | Sung | H10K 59/122 |
| 2024/0172483 | A1 | 5/2024 | Park et al. | |

* cited by examiner

DISPLAY DEVICE AND METHOD FOR PROVIDING THE SAME

This application claims priority to Korean Patent Application No. 10-2023-0062788 filed on May 16, 2023, all the benefits accruing therefrom under 35 U.S.C. 119, the contents of which in its entirety are herein incorporated by reference.

BACKGROUND

1. Field

The disclosure relates to a display device and a method for providing the same.

2. Description of the Related Art

With the advancement of the information age, the demand for a display device for displaying an image has increased with various forms. For example, the display device has been applied to various electronic devices such as a smart phone, a digital camera, a laptop computer, a navigator and a smart television. The display device may be a flat panel display device such as a liquid crystal display device, a field emission display device and an organic light emitting display device.

Among the flat panel display devices, the light emitting display device includes a light emitting element in which each of pixels of a display panel may self-emit light, thereby displaying an image even without a backlight unit that provides the display panel with light.

SUMMARY

A display device applied to glasses-type devices for providing virtual reality and augmented reality is implemented in a very small size of two inches or less in order to be applied to the glasses-type device, but should have a high pixel integration degree in order to be implemented with high resolution. For example, the display device may have a high pixel integration degree of 200 pixels per inch (PPI) or more.

When the display device is implemented in the very small size but has the high pixel integration degree as described above, areas of emission areas in which light emitting elements are disposed are reduced, and thus, it is difficult to implement light emitting elements separated from each other for each emission area through a mask process Aspects of the present disclosure provide a display device in which a separate light emitting element can be formed or provided in each of a plurality of emission areas without a mask process.

Aspects of the present disclosure also provide a display device with reduced damage to pixel electrodes caused by plasma exposure or etching processes performed during the process of manufacturing or providing the display device.

Aspects of the present disclosure also provide a method for manufacturing (or providing) a display device with reduced damage to pixel electrodes caused by plasma exposure or etching processes performed during the manufacturing process of the display device.

However, aspects of the present disclosure are not restricted to those set forth herein. The above and other aspects of the present disclosure will become more apparent to one of ordinary skill in the art to which the present disclosure pertains by referencing the detailed description of the present disclosure given below.

According to an embodiment of the disclosure, a display device includes a first pixel electrode disposed on a substrate, an inorganic insulating layer disposed on the substrate and exposing the first pixel electrode, a first light emitting layer disposed on the first pixel electrode, a first common electrode disposed on the first light emitting layer, a first bank layer disposed on the inorganic insulating layer and including zinc (Zn), a second bank layer disposed on the first bank layer and exposing the first common electrode, and a third bank layer disposed on the second bank layer, where the side surface of the second bank layer protrudes more than the side surface of the first bank layer, and the side surface of the third bank layer protrudes more than the side surface of the second bank layer.

The side surface of the first bank layer may be in contact with the first light emitting layer and may not be in contact with the first common electrode.

The first bank layer may include at least one or more of zinc indium tin oxide (ZITO), indium gallium zinc oxide (IGZO) and indium tin oxide (IZO).

The first bank layer may include zinc indium tin oxide (ZITO), and a ratio of tin (Sn) to a total number of atoms included in the first bank layer may be about 14 atomic percent (at %) to about 22 at %.

The protrusion length of the second bank layer may refer to the protrusion length of the side surface of the second bank layer relative to the side surface of the first bank layer, the protrusion length of the third bank layer may refer to the protrusion length of the side surface of the third bank layer relative to the side surface of the second bank layer, and the protrusion length of the second bank layer may be smaller than the protrusion length of the third bank layer.

The first bank layer may have a thickness ranging from 50 angstroms (Å) to about 600 Å.

The first common electrode may be in contact with the side surface of the second bank layer.

The inorganic insulating layer may not be in contact with the upper surface of the first pixel electrode, and one portion of the first light emitting layer may be disposed between the first pixel electrode and the inorganic insulating layer.

The display device may further include a residual pattern disposed between the inorganic insulating layer and the first pixel electrode and including zinc (Zn).

The residual pattern may include one or more of zinc indium tin oxide (ZITO), indium gallium zinc Oxide (IGZO), indium tin oxide (IZO) and zinc tin oxide (ZTO).

The side surface of the inorganic insulating layer may protrude more than the side surface of the third bank layer and the side surface of the residual pattern.

The second bank layer may include aluminum (Al), the third bank layer may include titanium (Ti), the thickness of the second bank layer may range from about 4,000 Å to about 10,000 Å, and the thickness of the third bank layer may range from about 500 Å to about 3,000 Å.

The display device may further include a first organic pattern disposed on the third bank layer and including the same material as that of the first light emitting layer a first electrode pattern disposed on the first organic pattern and including the same material as that of the first common electrode, and a first inorganic layer disposed on the upper surface of the first common electrode, the side surface of the second bank layer, the lower surface of the third bank layer, and the upper surface of the first electrode pattern, where the first light emitting layer and the first organic pattern may be separated, and the first common electrode and the first electrode pattern may be separated.

The display device may further include a second pixel electrode disposed on the substrate and spaced apart from the first pixel electrode, a second light emitting layer disposed on the second pixel electrode, a second common electrode disposed on the second light emitting layer and spaced apart from the first common electrode, a second organic pattern disposed on the third bank layer and including the same material as that of the second light emitting layer, a second electrode pattern disposed on the second organic pattern and including the same material as that of the second common electrode, and a second inorganic layer disposed on the upper surface of the second common electrode, the side surface of the second bank layer, the lower surface of the third bank layer and the upper surface of the second electrode pattern, where the inorganic insulating layer may expose the second pixel electrode, the second bank layer may expose the second common electrode, first inorganic layer and the second inorganic layer may be disposed to be spaced apart, and a portion of the third bank layer may be exposed in a space between the first inorganic layer and the second inorganic layer.

According to an embodiment of the disclosure, a method for fabricating a display device includes forming a plurality of pixel electrodes spaced apart from each other on a substrate, forming a sacrificial layer on the substrate and the plurality of pixel electrodes, forming an inorganic insulating material layer on the sacrificial layer, and forming a first bank material layer on the inorganic insulating material layer; forming a second bank material layer on the first bank material layer and forming a third bank material layer on the second bank material layer; etching the second bank material layer and the third bank material layer to form a hole exposing the first bank material layer overlapping the plurality of pixel electrodes; wet etching the side surface of the second bank material layer exposed through the hole to partially expose a lower surface of the third bank material layer; etching the first bank material layer and the sacrificial layer to expose a plurality of pixel electrodes; and forming a first light emitting layer and a first common electrode on a first pixel electrode among the plurality of pixel electrodes, and forming a first organic pattern material layer and a first electrode pattern material layer on the third bank material layer.

In the etching the sacrificial layer to expose a plurality of pixel electrodes, a portion of the lower surface of the second bank material layer and a portion of the lower surface of the inorganic insulating material layer may be exposed, and a portion of the sacrificial layer may remain as a residual pattern without being etched.

The first bank material layer and the sacrificial layer include zinc (Zn).

The first bank material layer includes zinc indium tin oxide (ZITO), and a ratio of tin (Sn) included in the first bank material layer is about 14 at % to about 22 at %.

The method for fabricating a display device may further include forming a first inorganic material layer on the first common electrode and the first electrode pattern material layer, forming a mask pattern on the first inorganic material layer overlapping the first pixel electrode, and etching the first organic pattern material layer, the first electrode pattern material layer and the first inorganic material layer not covered by the mask pattern through an etching process.

The method for fabricating a display device may further include forming a second light emitting layer and a second common electrode on a second pixel electrode of the plurality of pixel electrodes, and forming a second organic pattern material layer and a second electrode pattern material layer on the third bank material layer, forming a second inorganic material layer on the second common electrode and the second electrode pattern material layer; and etching a mask pattern on the second inorganic material layer overlapping the second pixel electrode, and forming the second organic pattern material layer, the second electrode pattern material layer and the second inorganic material layer through an etching process.

In the display device and the method of manufacturing the same according to an embodiment of the present disclosure, a first bank layer disposed on the lower end of a bank structure contains zinc (Zn), so that an inorganic insulating layer and a pixel electrode may be prevented from being damaged during an etching process.

In the display device and the method of manufacturing the same according to an embodiment of the present disclosure, since the first bank layer contains zinc (Zn) and can be etched together with a sacrificial layer, the manufacturing process can be simplified.

However, effects according to the embodiments of the present disclosure are not limited to those exemplified above and various other effects are incorporated herein.

BRIEF DESCRIPTION OF THE DRAWINGS

The above and other aspects and features of the present disclosure will become more apparent by describing in detail embodiments thereof with reference to the attached drawings, in which.

DETAILED DESCRIPTION

Figure 1:
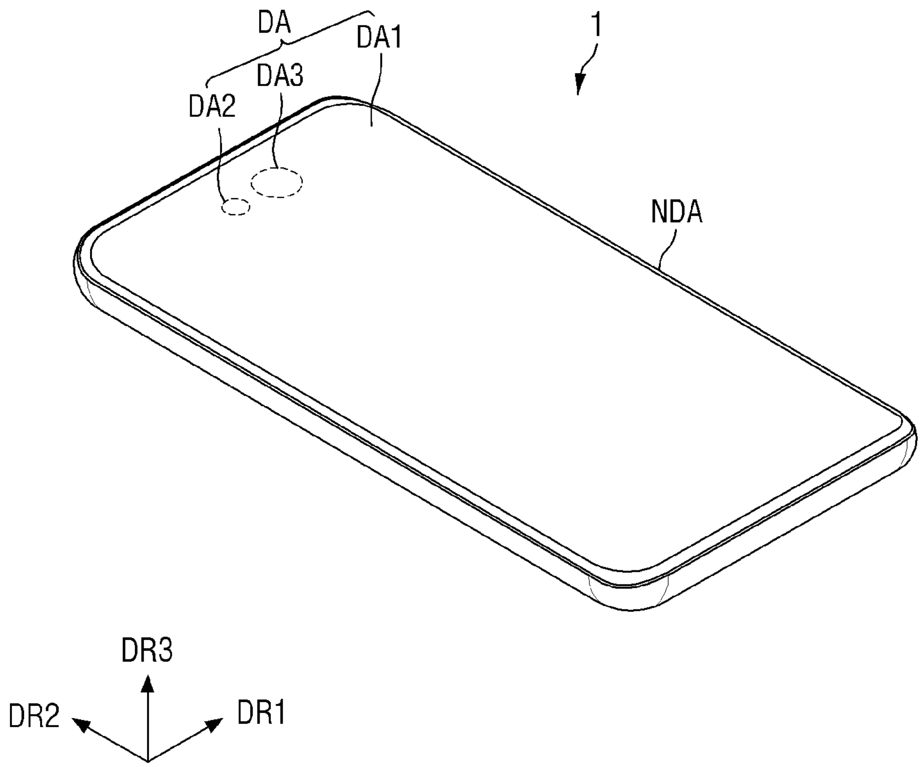
FIG. 1 is a schematic perspective view illustrating an electronic device according to an embodiment.

The invention will now be described more fully hereinafter with reference to the accompanying drawings, in which embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art.

It will also be understood that when a layer is referred to as being related to another element such as being "on" another layer or substrate, it can be directly on the other layer or substrate, or intervening layers may also be present. In contrast, when a layer is referred to as being related to another element such as being "directly on" another layer or substrate, no intervening layer is present therebetween.

The same reference numbers indicate substantially the same components throughout the specification. For example, within the Figures and the text of the disclosure, a reference number indicating a singular form of an element may also be used to reference a plurality of the singular element.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the invention. Similarly, the second element could also be termed the first element.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. Thus, reference to "an" element in a claim followed by reference to "the" element is inclusive of one element and a plurality of the elements. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments will be described with reference to the accompanying drawings.

FIG. 1 is a schematic perspective view illustrating an electronic device 1 according to an embodiment.

Referring to FIG. 1, an electronic device 1 displays a moving image and/or a still image. The electronic device 1 may refer to all electronic devices that provide a display screen. For example, a television, a laptop computer, a monitor, an advertising board, Internet of Things, a mobile phone, a smart phone, a tablet personal computer (PC), an electronic watch, a smart watch, a watch phone, a head mounted display, a mobile communication terminal, an electronic diary, an electronic book, a portable multimedia player (PMP), a navigator, a game machine, a digital camera, a camcorder and the like may be included in the electronic device 1.

The electronic device 1 may include a display device 10 (see FIG. 2) for providing a display screen. Examples of the display device 10 include an inorganic light emitting diode display device, an organic light emitting display device, a quantum dot light emitting display device, a plasma display device and a field emission display device. Hereinafter, an organic light emitting diode display device is applied as an example of the display device 10, but the example of the display device 10 is not limited to the organic light emitting diode display device, and another display device 10 may be applied when the same technical spirits are applicable thereto.

Various modifications may be made in a shape of the electronic device 1. For example, in a plan view, the electronic device 1 may have a rectangular shape that is long in a horizontal direction, a rectangular shape that is long in a vertical direction crossing the horizontal direction, a square shape, a square shape with rounded corners (vertexes), other polygonal shape, a circular shape, etc. A planar shape of a display area DA of the electronic device 1 may be also similar to the overall planar shape of the electronic device 1. An electronic device 1 of a rectangular shape that is longer in a second direction DR2 is illustrated in FIG. 1.

The electronic device 1 may include a display area DA and a non-display area NDA. The display area DA is an area (e.g., a planar area) in which a screen is provided and/or an image is displayed, and the non-display area NDA is an area in which a screen is not provided and/or an image is not displayed. The display area DA may be referred to as an active area, and the non-display area NDA may be referred to as a non-active area. The display area DA may generally occupy the center of the electronic device 1. The non-display area NDA is adjacent to the display area DA in a plan view.

Various components or layers of the electronic device 1 may include a display area DA and a non-display area NDA corresponding to those described above.

The display area DA may include a first display area DA1, a second display area DA2 and a third display area DA3 as various sub-display areas within the overall planar area of the display area DA. In the second display area DA2 and the third display area DA3, components for adding a variety of features or functions to the electronic device 1 may be disposed. In other words, the second display area DA2 and the third display area DA3 may be referred to as component areas. The components may be a functional component such as an optical device 500 shown in FIG. 3.

Figure 2:
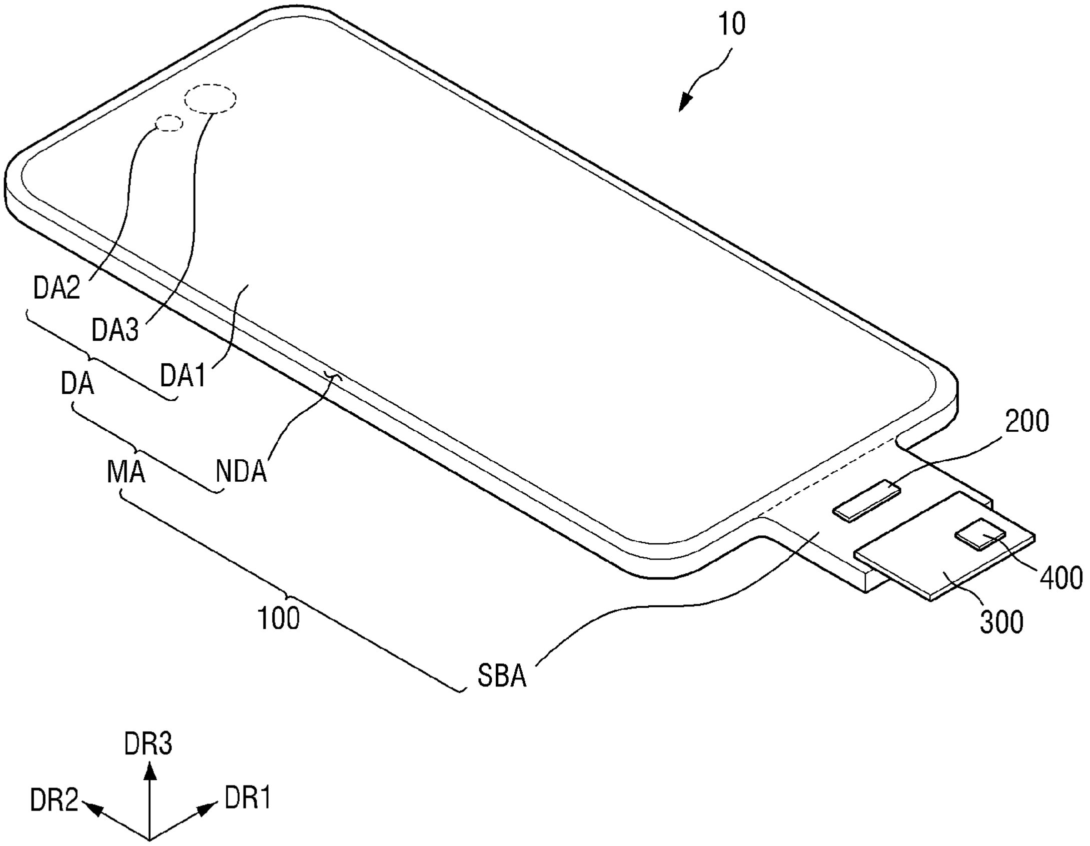
FIG. 2 is a perspective view illustrating a display device included in an electronic device according to an embodiment.

FIG. 2 is a perspective view illustrating a display device 10 included in an electronic device 1 according to an embodiment.

Referring to FIG. 2, the electronic device 1 according to an embodiment may include a display device 10. The display device 10 may provide a screen (e.g., a display screen) at which an image is displayed by the electronic device 1. The display device 10 may have a planar shape similar to that of the electronic device 1. For example, the display device 10 may have a shape similar to a rectangular shape having a short side in a first direction DR1 and a long side in a second direction DR2. A corner at which the short side in the first direction DR1 and the long side in the second direction DR2 meet may be rounded to have a curvature in the plan view, but is not limited thereto, and may be formed at a right angle. The planar shape of the display device 10 is not limited to a quadrangle and may be formed (or provided) to be similar to other polygonal shape, a circular shape or an elliptical shape.

The planar shape of the electronic device 1 and various components or layers thereof may be disposed in a plane defined by the first direction DR1 and the second direction DR2 which cross each other. A planar view may be along a direction crossing the plane, such as a third direction DR3. The electronic device 1 and various components or layers thereof may have a thickness along the third direction DR3.

The display device 10 may include a display panel 100, a display driver 200, a circuit board 300 and a touch driver 400.

The display panel 100 may include a main area MA and a sub-area SBA.

The main area MA may include a display area DA including pixels PX for generating and/or displaying an image, emitting light, etc., and a non-display area NDA disposed near the display area DA such as to be adjacent thereto. The display area DA may include a first display area DA1, a second display area DA2 and a third display area DA3. The display area DA may emit light from a plurality of emission areas (e.g., a light emission area provided in plural) or a plurality of opening areas (e.g., a light emission opening provided in plural). For example, the display panel 100 may include a pixel circuit including switching elements, a pixel defining layer defining a emission area or an opening area, and a self-light emitting element.

For example, the self-light emitting element may include at least one of an organic light emitting diode including an organic light emitting layer, a quantum dot light emitting diode (LED) including a quantum dot light emitting layer, an inorganic LED including an inorganic semiconductor and a micro LED.

The non-display area NDA may be an area outside the display area DA, such as closer to an outer edge of the electronic display device 1 than the display area DA. The non-display area NDA may be defined as an edge area of the main area MA of the display panel 100. A boundary may be defined between the display area DA and the non-display area NDA. A boundary may be defined between the main area MA and the sub-area SBA.

The non-display area NDA may include a scan driver 210 (see FIG. 4) supplying electrical signals such as scan signals (or injection signals) to scan lines SL (or injection lines) and fan-out lines FOL (see FIG. 4) connecting the display driver 200 and the display area DA to each other.

The sub-area SBA may be an area extending from one side of the main area MA. The sub-area SBA may be considered a portion of the non-display area NDA, without being limited thereto. The sub-area SBA may include a flexible material that may be bent, folded, and rolled. The sub-area SBA may be an area at which the electronic device 1 and various components or layers thereof is bendable, foldable, rollable, etc. For example, when the sub-area SBA is bent, the sub-area SBA may overlap the main area MA in (or along) a thickness direction (e.g., third direction DR3). That is, the electronic device 1 (or the display device 10) which is bent at the sub-area SBA may dispose a portion of the sub-area SBA overlapping the main area MA along the thickness direction of the electronic device 1.

The sub-area SBA may include the display driver 200 and pad parts (e.g., a pad provided in plural) which are connected (e.g., electrical and/or physically connected) to the circuit board 300. In another embodiment, the sub-area SBA may be omitted, and the display driver 200 and the pad parts may be disposed in the non-display area NDA.

The display driver 200 may output electrical signals and electrical voltages for driving the display panel 100. The display driver 200 may supply data voltages as electrical voltages, to data lines DL as signal lines. The display driver 200 may supply source voltages as electrical signals, to power lines VL and supply scan control signals as electrical signals, to the scan driver 210. The display driver 200 may be formed as an integrated circuit (IC) and mounted on the display panel 100 in a chip on glass (COG) manner, a chip on plastic (COP) manner, or an ultrasonic bonding manner. As an example, the display driver 200 may be disposed in the sub-area SBA, and may overlap the main area MA in the thickness direction (third direction DR3) in a display device 10 which is bent by bending of the sub-area SBA. As another example, the display driver 200 may be mounted on the circuit board 300.

The circuit board 300 may be attached onto the pad parts of the display panel 100 using an anisotropic conductive film (ACF). Lead lines of the circuit board 300 may be electrically connected to the pad parts of the display panel 100. That is, the circuit board 300 may be connected to the display panel 100 at the pad parts thereof. The circuit board 300 may be a flexible printed circuit board, a printed circuit board, or a flexible film such as a chip on film.

The touch driver 400 may be mounted on the circuit board 300. The touch driver 400 may be connected to a touch sensing unit (or touch sensing panel) of the display panel 100. The touch driver 400 may supply touch driving signals as electrical signals, to a plurality of touch electrodes of the touch sensing unit and sense change amounts in electrical capacitance between the plurality of touch electrodes. For example, the touch driving signal may be a pulse signal having a predetermined frequency. The touch driver 400 may decide whether or not a touch input as an external input has been generated relative to the electronic device 1 and calculate touch coordinates, based on the amounts of change in capacitance between the plurality of touch electrodes. The touch driver 400 may be formed as an integrated circuit (IC).

Figure 3:
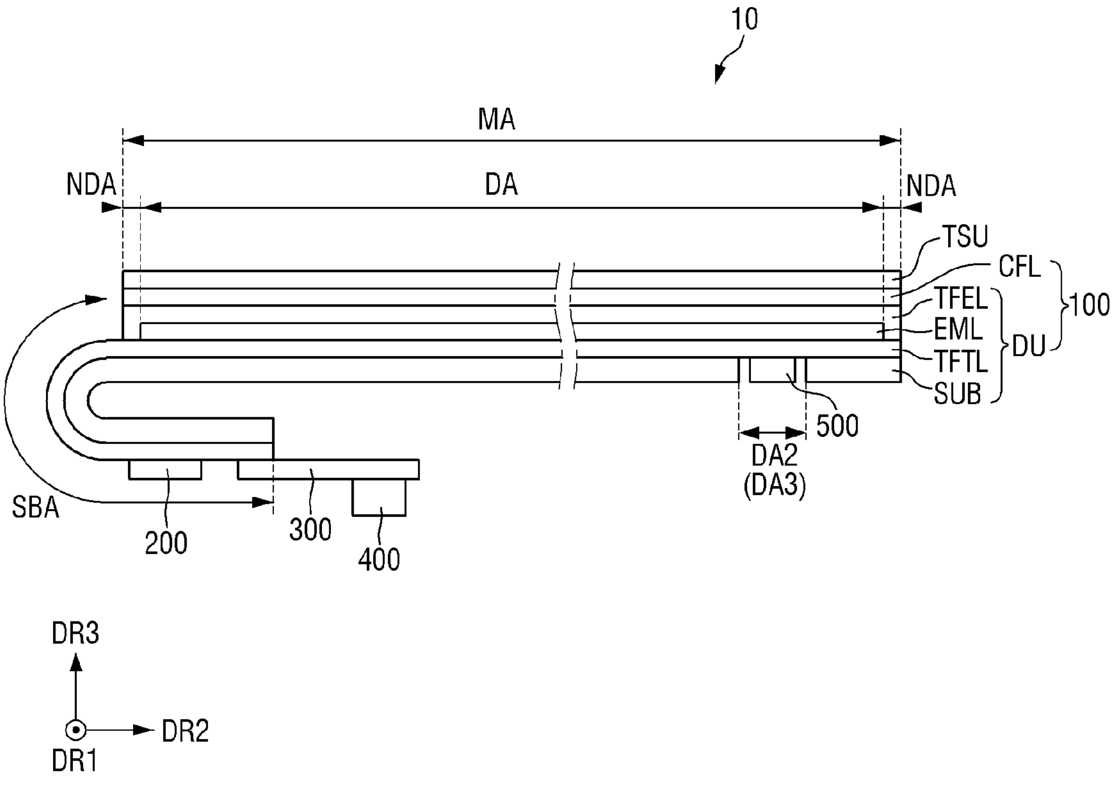
FIG. 3 is a cross-sectional view illustrating the display device of FIG. 2 according to an embodiment.

FIG. 3 is a cross-sectional view illustrating that the display device 10 of FIG. 2 according to an embodiment.

Referring to FIG. 3, the display panel 100 may include a display layer DU and a color filter layer CFL. The display layer DU may include a substrate SUB, a thin film transistor layer TFTL as a pixel circuit layer, a light emitting element layer EML as a display element layer, and a thin film encapsulation layer TFEL as an encapsulation layer.

The substrate SUB may be a base substrate or a base member. The substrate SUB may be a flexible substrate that may be bent, folded, and rolled. For example, the substrate SUB may include a polymer resin such as polyimide (PI), but is not limited thereto. In another embodiment, the substrate SUB may include a glass material or a metal material.

The thin film transistor layer TFTL may be disposed on the substrate SUB. The thin film transistor layer TFTL may include a plurality of thin film transistors constituting pixel circuits of pixels PX. The thin film transistor layer TFTL may further include scan lines SL, data lines DL, power lines VL, scan control lines SCL, fan-out lines FOL connecting the display driver 200 and the data lines DL to each other, and lead lines connecting the display driver 200 and the pad parts to each other. Each of the thin film transistors may include a semiconductor region, a source electrode, a drain electrode, and a gate electrode. For example, when the scan driver 210 is formed on one side of the non-display area NDA of the display panel 100, the scan driver 210 may include thin film transistors.

The thin film transistor layer TFTL may be disposed in the display area DA, the non-display area NDA, and the sub-area SBA. The thin film transistors of each of the pixels PX, the scan lines SL, the data lines DL, and the power lines VL of the thin film transistor layer TFTL may be disposed in the display area DA. The scan control lines SCL and the fan-out lines FOL of the thin film transistor layer TFTL may be disposed in the non-display area NDA. The lead lines of the thin film transistor layer TFTL may be disposed In the sub-area SBA.

The light emitting element layer EML may be disposed on the thin film transistor layer TFTL. The light emitting element layer EML may include a plurality of light emitting elements each including a first electrode, a second electrode, and a light emitting layer to emit light and a pixel defining layer defining areas of the pixels PX. The plurality of light emitting elements of the light emitting element layer EML may be disposed in the display area DA.

In an embodiment, the light emitting layer may be an organic light emitting layer including an organic material. The light emitting layer may include a hole transporting layer, an organic light emitting layer, and an electron transporting layer. When the first electrode receives a voltage through the thin film transistor of the thin film transistor layer TFTL and the second electrode receives a cathode voltage, holes and electrons may move to the organic light emitting layer through the hole transporting layer and the electron transporting layer, respectively, and may be combined with each other in the organic light emitting layer to emit light.

In another embodiment, the light emitting element may include a quantum dot light emitting diode including a quantum dot light emitting layer, an inorganic light emitting diode including an inorganic semiconductor, or a micro light emitting diode.

The thin film encapsulation layer TFEL may cover an upper surface and side surfaces of the light emitting element layer EML, and may protect the light emitting element layer EML from external elements such as moisture, air, other contaminants, etc. The thin film encapsulation layer TFEL may include at least one inorganic film together with at least one organic film for encapsulating the light emitting element layer EML.

A touch sensing layer TSU as a touch sensing panel may be positioned on the display layer DU. The touch sensing layer TSU may obtain coordinates of a touch input point in a capacitance manner. The touch sensing layer TSU may obtain coordinate information of a touched point in a self-capacitance manner or a mutual capacitance manner as an example of the capacitance manner, but is not limited thereto. The touch sensing layer TSU may be connected to the display layer DU. In an embodiment, the touch sensing layer TSU may be connected to the display layer DU at a first touch pad TP1 (see FIG. 4) and/or a second touch pad TP2 (see FIG. 4).

The color filter layer CFL may be disposed on the thin film encapsulation layer TFEL. The color filter layer CFL may include a plurality of color filters each corresponding to an emission area (e.g., a total of the plurality of emission areas). Each of the color filters may selectively transmit light of a specific wavelength therethrough and block or absorb light of other wavelengths. The color filter layer CFL may absorb some of light introduced from the outside of the display device 10 to reduce reflected light by external light. Accordingly, the color filter layer CFL may prevent distortion of colors due to external light reflection.

Referring to FIG. 3, since the color filter layer CFL is directly disposed on the thin film encapsulation layer TFEL, the display device 10 may not require a separate substrate for the color filter layer CFL. That is, the display device 10 may function as a base layer for the color filter layer CFL. Accordingly, a thickness of the display device 10 may be relatively small.

In some embodiments, the display device 10 may further include an optical device 500. The optical device 500 may be disposed in the second display area DA2 and/or the third display area DA3. The optical device 500 may emit or receive light of infrared, ultraviolet, and visible light bands. For example, the optical device 500 may be a functional component such as an optical sensor sensing light incident on the display device 10, such as a proximity sensor sensing a location or proximity of an external object to the display device 10, an illuminance sensor receiving light and/or providing light relative to the display device 10, a camera sensor sensing an object and/or light outside of the display device 10 and providing an image or view of such object, a fingerprint sensor sensing a fingerprint of an input tool such as a user, or an image sensor sensing an image outside of the display device 10.

Figure 4:
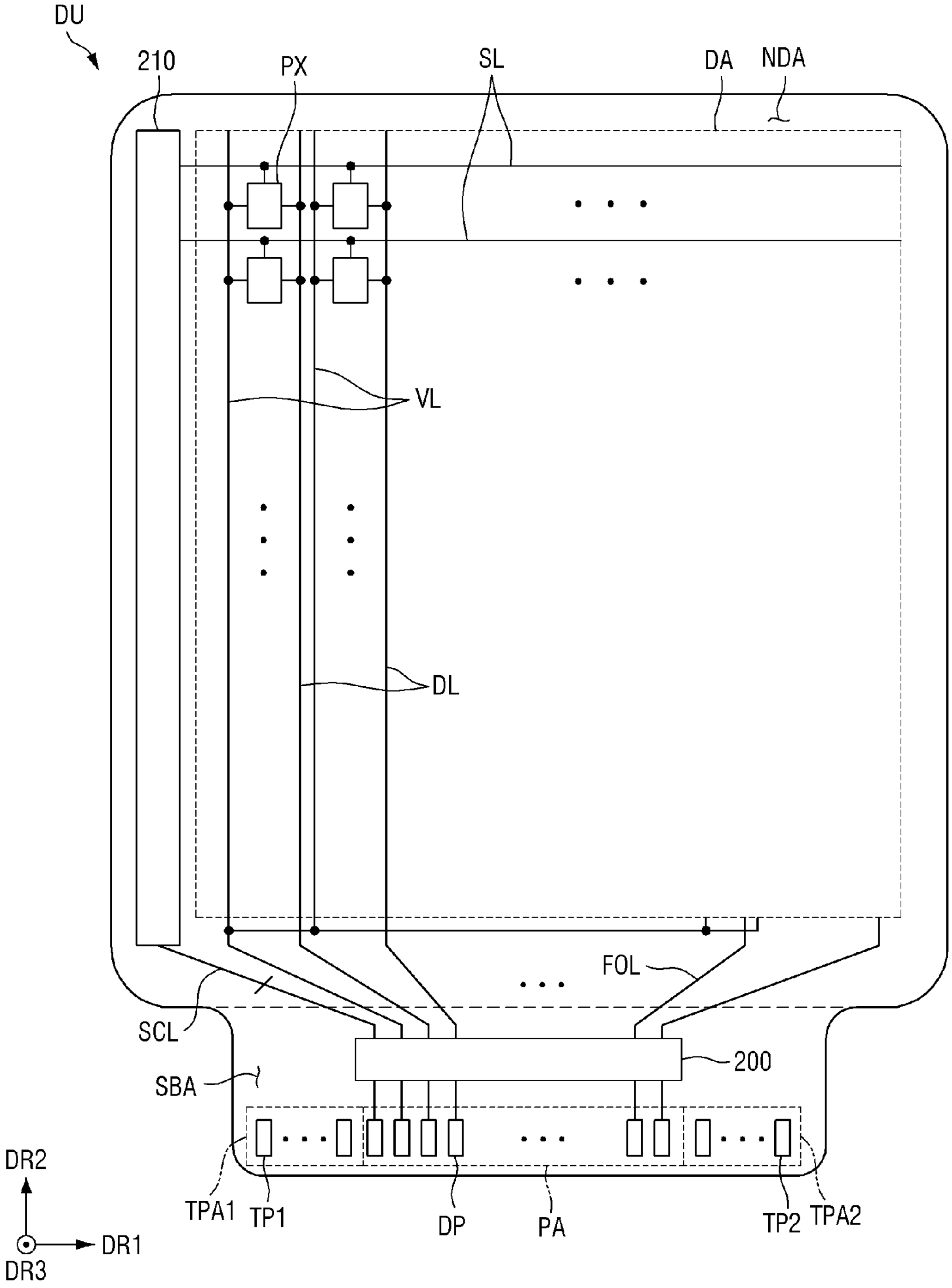
FIG. 4 is a plan view illustrating a display layer of a display device according to an embodiment.

FIG. 4 is a top plan view illustrating a display layer DU of a display device 10 according to an embodiment.

Referring to FIG. 4, the display layer DU may include a display area DA and a non-display area NDA.

The display area DA may be disposed at the center of the display panel 100, or at least spaced apart from an outer edge of the display device 10. A pixel PX provided in plural including plurality of pixels PX, a scan line as a signal line provided in plural including a plurality of scan lines SL, a data line as a signal line provided in plural including a plurality of data lines DL, and a power line as a signal line provided in plural a plurality of power lines VL may be disposed in the display area DA. Each of the plurality of pixels PX may be defined as a minimum unit emitting light.

The plurality of scan lines SL may supply scan signals received from the scan driver 210, to the plurality of pixels PX. The plurality of scan lines SL may extend to have a major dimension in the first direction DR1, and may be spaced apart from each other in the second direction DR2 crossing the first direction DR1.

The plurality of data lines DL may supply data voltages received from the display driver 200, to the plurality of pixels PX. The plurality of data lines DL may extend to have a major dimension in the second direction DR2, and may be spaced apart from each other in the first direction DR1.

The plurality of power lines VL may supply a source voltage received from the display driver 200, to the plurality of pixels PX. Here, the source voltage may be at least one or more electrical signal such as a driving voltage, an initialization voltage, a reference voltage, and a low potential voltage. The plurality of power lines VL may extend to have a major dimension in the second direction DR2, and may be spaced apart from each other in the first direction DR1.

The non-display areas NDA may surround the display area DA in the plan view, without being limited thereto. The scan driver 210, a fan-out line FOL provided in plural including a plurality of fan-out lines FOL, and scan control lines SCL may be disposed in the non-display area NDA. The scan driver 210 may generate a plurality of scan signals based on scan control signals, and may sequentially supply the plurality of scan signals to the plurality of scan lines SL according to a set order.

The fan-out lines FOL may extend from the display driver 200 in the non-display area NDA, to the display area DA. The fan-out lines FOL may supply the data voltages received from the display driver 200, to the plurality of data lines DL.

The scan control lines SCL may extend from the display driver 200 to the scan driver 210, within the non-display area NDA. The scan control lines SCL may supply the scan control signals received from the display driver 200 to the scan driver 210.

The sub-area SBA may include the display driver 200, a pad area PA, and first and second touch pad areas TPA1 and TPA2.

The display driver 200 may output signals and voltages for driving the display panel 100 to the fan-out lines FOL. The display driver 200 may supply the data voltages to the data lines DL through the fan-out lines FOL. The data voltages may be supplied to the plurality of pixels PX, and may control luminance of the plurality of pixels PX. The display driver 200 may supply the scan control signals to the scan driver 210 through the scan control lines SCL.

The pad area PA, the first touch pad area TPA1, and the second touch pad area TPA2 may be disposed at an edge of the sub-area SBA which is furthest from the main area MA. Elements and/or components within the pad area PA, the first touch pad area TPA1, and the second touch pad area TPA2 may be electrically connected to the circuit board 300, such as by using a material such as an anisotropic conductive film or a self assembly anisotropic conductive paste (SAP).

The pad area PA may include a pad provided in plural including a plurality of display pad parts DP. The plurality of display pad parts DP may be connected to an external component such as a graphic system or graphic controller (not shown), through the circuit board 300. The plurality of display pad parts DP may be connected to the circuit board 300 to receive digital video data, and may supply the digital video data to the display driver 200. That is, the circuit board 300 may be connected to the display panel 100 at the display layer DU, such as at the display pad thereof, without being limited thereto.

Figure 5:
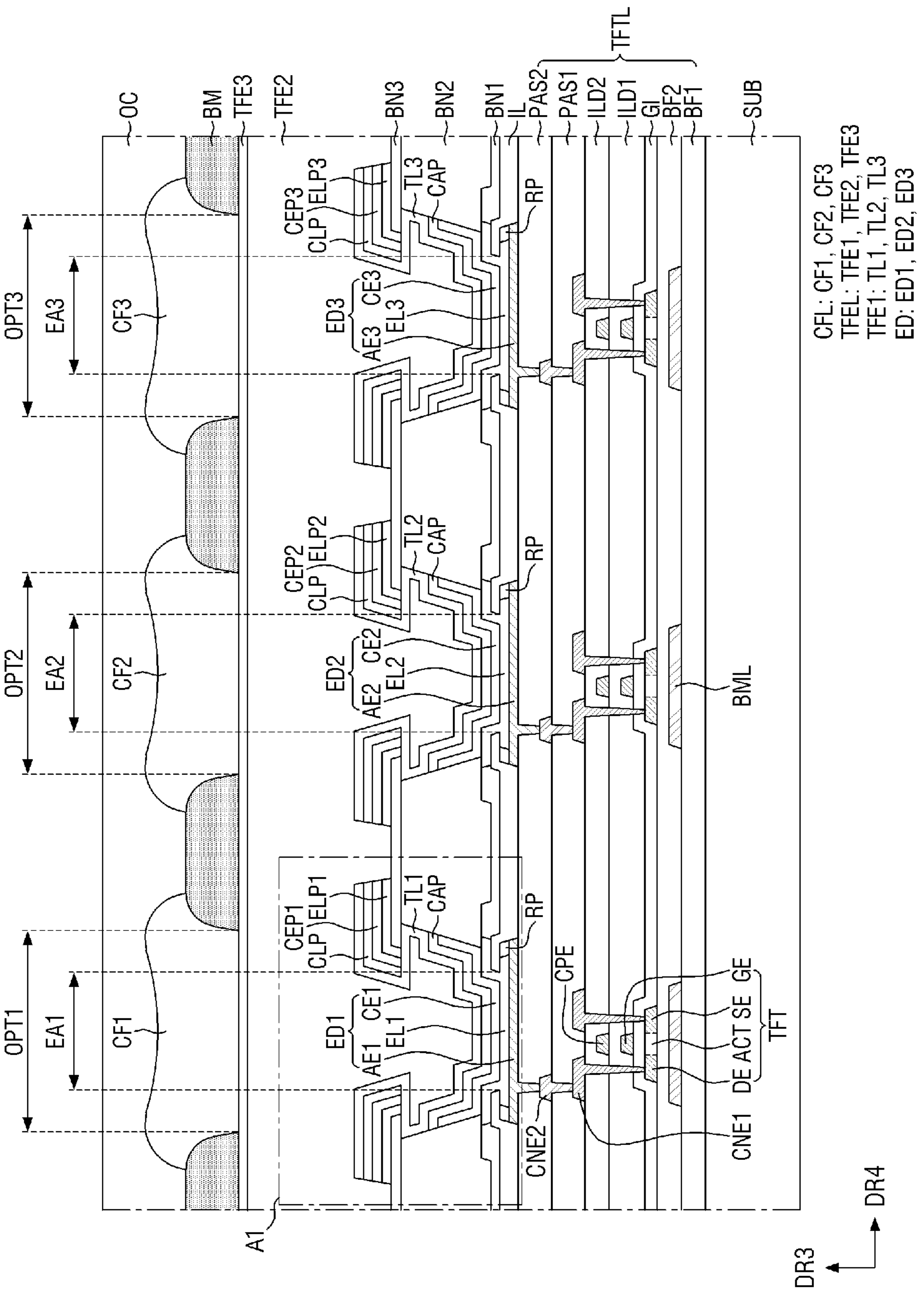
FIG. 5 is an enlarged cross-sectional view illustrating a portion of a display device according to an embodiment.

FIG. 5 is a cross-sectional view illustrating a portion of a display device 10 according to an embodiment. FIG. 5 is a partial cross-sectional view of the display device 10 and illustrates an enlarged cross-section of a substrate SUB, a thin film transistor layer TFTL, a light emitting element layer EML and a thin film encapsulation layer TFEL of the display layer DU, and a color filter layer CFL which faces the display layer DU.

Referring to FIG. 5, a display panel 100 of the display device 10 may include a display layer DU and a color filter layer CFL. The display layer DU may include a substrate SUB, a thin film transistor layer TFTL, a light emitting element layer EML and a thin film encapsulation layer TFEL together with each other. The display panel 100 includes a light shielding layer BM disposed on the thin film encapsulation layer TFEL and the color filters CF of the color filter layer CFL may be disposed on the light shielding layer BM. In an embodiment, the light shielding patterns within a light shielding layer may be considered a layer of the color filter layer CFL, without being limited thereto.

The substrate SUB may be a base substrate or a base member. The substrate SUB may be a flexible substrate that may be bendable, foldable and/or rollable. For example, the substrate SUB may include a polymer resin such as polyimide (PI), but is not limited thereto. For another example, the substrate SUB may include a glass material or a metal material.

The thin film transistor layer TFTL may include a first buffer layer BF1, a lower metal layer BML as a pattern of a lower metal pattern layer, a second buffer layer BF2, a thin film transistor TFT, a gate insulating layer GI, a first interlayer dielectric layer ILD1, a capacitor electrode CPE as a pattern of a capacitor electrode layer, a second interlayer dielectric layer ILD2, a first connection electrode CNE1 as a pattern of a first connection electrode layer, a first passivation layer PAS1, a second connection electrode CNE2 as a pattern of a second connection electrode layer, and a second passivation layer PAS2. As used herein, one or more of the various layers among the first buffer layer BF1, the second buffer layer BF2, the gate insulating layer GI, the first interlayer dielectric layer ILD1, the second interlayer dielectric layer ILD2, the first passivation layer PAS1 and the second passivation layer PAS2 may together define and be referred to as an insulating layer.

The first buffer layer BF1 may be disposed on the substrate SUB. The first buffer layer BF1 may include an inorganic layer capable of preventing the air or moisture from being permeated thereinto. For example, the first buffer layer BF1 may include a plurality of inorganic layers that are alternately stacked.

The lower metal layer BML may be disposed on the first buffer layer BF1. For example, the lower metal layer BML may be formed of or include a single layer or multiple layers made of one of molybdenum (Mo), aluminum (Al), chromium (Cr), gold (Au), titanium (Ti), nickel (Ni), neodymium (Nd) and copper (Cu) and their alloy.

The second buffer layer BF2 may cover the first buffer layer BF1 and the lower metal layer BML. The second buffer layer BF2 may include an inorganic layer capable of preventing permeation of the air or moisture from occurring. For example, the second buffer layer BF2 may include a plurality of inorganic layers that are stacked.

The thin film transistor TFT may be disposed on the second buffer layer BF2, and may constitute an element of a pixel circuit of each of a plurality of pixels PX. For example, the thin film transistor TFT may be a driving transistor or a switching transistor of the pixel circuit. The thin film transistor TFT may include a semiconductor layer ACT as an active layer, a source electrode SE as a source, a drain electrode DE as a drain, and a gate electrode GE as a gate.

The semiconductor layer ACT may be disposed on the second buffer layer BF2. The semiconductor layer ACT may overlap or correspond to the lower metal layer BML and the gate electrode GE in the thickness direction DR3, and may be insulated from the gate electrode GE by the gate insulating layer GI. A portion of the semiconductor layer ACT may form the source electrode SE and the drain electrode DE through electrical condutorization of a material of the semiconductor layer ACT.

The gate electrode GE may be disposed on the gate insulating layer GI. The gate electrode GE may overlap the semiconductor layer ACT with the gate insulating layer GI interposed therebetween in the thickness direction DR3.

The gate insulating layer GI may be disposed on the semiconductor layer ACT. For example, the gate insulating layer GI may cover the semiconductor layer ACT and the second buffer layer BF2, and may insulate the semiconductor layer ACT from the gate electrode GE. The gate insulating layer GI may include (or define) a contact hole therein, through which the first connection electrode CNE1 passes.

The first interlayer dielectric layer ILD1 may cover the gate electrode GE and the gate insulating layer GI. The first interlayer dielectric layer ILD1 may include a contact hole therein, through which the first connection electrode CNE1 passes. The contact hole of the first interlayer dielectric layer ILD1 may be connected to or aligned with a contact hole of the gate insulating layer GI and a contact hole of the second interlayer dielectric layer ILD2, to form a single contact hole.

The capacitor electrode CPE may be disposed on the first interlayer dielectric layer ILD1. The capacitor electrode CPE may overlap the gate electrode GE in the thickness direction DR3. The capacitor electrode CPE and the gate electrode GE may form an electrical capacitance therebetween.

The second interlayer dielectric layer ILD2 may cover the capacitor electrode CPE and the first interlayer dielectric layer ILD1. The second interlayer dielectric layer ILD2 may include a contact hole therein, through which the first connection electrode CNE1 passes. The contact hole of the second interlayer dielectric layer ILD2 may be connected to or aligned with the contact hole of the first interlayer dielectric layer ILD1 and the contact hole of the gate insulating layer GI.

The first connection electrode CNE1 may be disposed on the second interlayer dielectric layer ILD2. The first connection electrode CNE1 may electrically connect the drain electrode DE of the thin film transistor TFT with the second connection electrode CNE2. The first connection electrode CNE1 may be inserted into the respective contact holes provided in the second interlayer dielectric layer ILD2, the first interlayer dielectric layer ILD1 and the gate insulating layer GI, and then may be in contact with the drain electrode DE of the thin film transistor TFT, at the aligned contact holes. As being in contact, elements may form an interface therebetween, without being limited thereto.

The first passivation layer PAS1 may cover the first connection electrode CNE1 and the second interlayer dielectric layer ILD2. The first passivation layer PAS1 may protect the thin film transistor TFT. The first passivation layer PAS1 may include a contact hole therein, through which the second connection electrode CNE2 passes.

The second connection electrode CNE2 may be disposed on the first passivation layer PAS1. The second connection electrode CNE2 may electrically connect a first connection electrode CNE1 with a respective electrode among a plurality of pixel electrodes AE1, AE2 and AE3 of the light emitting elements ED. The second connection electrode CNE2 may be inserted into the contact hole provided in the first passivation layer PAS1, and then may be in contact with the first connection electrode CNE1, at the contact hole.

The second passivation layer PAS2 may cover the second connection electrode CNE2 and the first passivation layer PAS1. The second passivation layer PAS2 may include a contact hole therein, through which a respective electrode among the pixel electrodes AE1, AE2 and AE3 of the light emitting element ED pass to be in electrical connection with the pixel circuit layer.

The light emitting element layer EML may be disposed on the thin film transistor layer TFTL. The light emitting element layer EML may include a light emitting element ED provided in plural including a plurality of light emitting elements ED, a residual pattern RP, an inorganic insulating layer IL, a capping layer CAP as a pattern of a first capping layer, a bank structure BNS as a bank, first to third organic patterns ELP1, ELP2 and ELP3 as patterns of an organic pattern layer, first to third electrode patterns CEP1, CEP2 and CEP3 as patterns of an electrode layer, and a capping pattern CLP as a pattern of a second capping layer. The light emitting element ED may include pixel electrodes AE1, AE2 and AE3, light emitting layers EL1, EL2 and EL3, and common electrodes CE1, CE2 and CE3.

Figure 6:
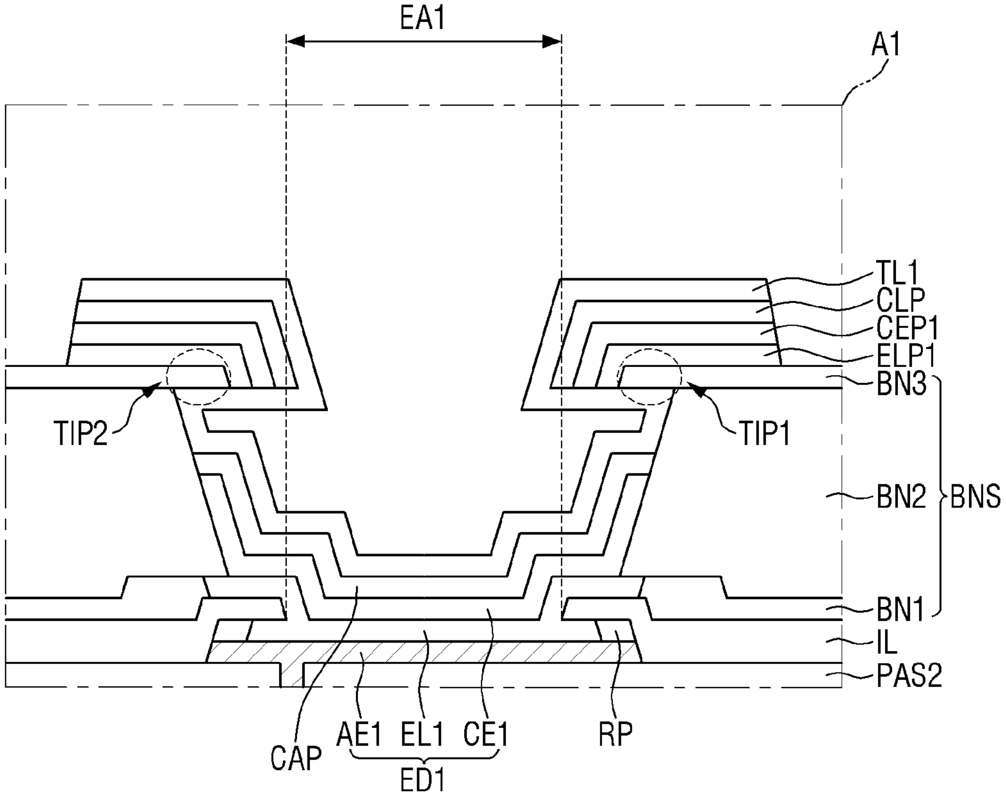
FIG. 6 is an enlarged crops-sectional view illustrating area A1 of FIG. 5.

FIG. 6 is an enlarged view illustrating a first emission area EA1, specifically cross-sectional area A1 of FIG. 5.

Referring to FIG. 6 together with FIG. 5, the display device 10 may include a plurality of emission areas EA1, EA2 and EA3 disposed in the display area DA. The emission areas EA1, EA2 and EA3 may include or define planar areas at which light is emitted from the light emitting elements ED1, ED2 and ED3 and passes to the color filter layer CFL in the third direction DR3, respectively. The emission areas EA1, EA2 and EA3 may include a first emission area EA1, a second emission area EA2 and a third emission area EA3, which emit light of different colors from each other. Each of the first to third emission areas EA1, EA2 and EA3 may variously emit red light, green light or blue light, and a color of light emitted from each of the emission areas EA1, EA2 and EA3 may vary depending on a type of the light emitting element ED disposed in the light emitting element layer EML.

In an embodiment, the first pixel electrode AE1, the first light emitting layer EL1, and the first common electrode CE1 may be sequentially stacked so that the first emission area EA1 may emit first light of a red color, the second pixel electrode AE2, the second light emitting layer EL2, and the second common electrode CE2 may be sequentially stacked so that the second emission area EA2 may emit second light of a green color, and the third pixel electrode AE3, the third light emitting layer EL3, and the third common electrode CE3 may be sequentially stacked so that the third emission area EA3 may emit third light of a blue color, but the present disclosure is not limited thereto.

A plurality of openings formed or defined in a bank structure BNS of the light emitting element layer EML are defined along a boundary of the bank structure BNS. That is, a solid portion (or solid material portion) of a bank layer may be defined by the bank structure BNS and disconnected along any direction along plane defined by the first direction DR1 and second direction DR2 crossing each other (see a fourth direction DR4 in FIG. 5, for example) to define a bank opening. In an embodiment, a plurality of solid portions of the bank layer are spaced apart from each other along the display layer DU (e.g., in one or more direction along a plane) to respectively define a plurality of bank openings.

Referring to FIGS. 5 and 6, a solid portion includes a first bank layer BN1, a second bank layer BN2, and a third bank layer BN3 of the bank structure BNS. The various bank layers may have or define a planar shape in which they together surround the emission areas EA1, EA2 and EA3. The openings of the bank layer may include or be aligned with the first to third emission areas EA1, EA2 and EA3. The opening of the bank layer may include not only planar dimensions of the first emission area EA1 but also an exposed planar area of the first pixel electrode AE1 that is not covered by the first bank layer BN1 and the residual pattern RP.

In an embodiment, relative to a same direction, respective dimensions of an opening at the first bank layer BN1, the second bank layer BN2, and the third bank layer BN3 of the bank structure BNS may be different from each other. Sidewalls of the respective bank layer may define the bank opening. A volume of the bank opening at a respective bank layer may be defined by a planar dimension of the opening at such bank layer (e.g., between opposing sidewalls) together with a height or thickness at such respective bank layer. Multiple volumes may together define a whole of the bank opening. Herein, a dimension along the same direction of the bank opening may be defined by the maximum dimension, the minimum dimension, etc.

In an embodiment, planar areas or sizes of the first to third emission areas EA1, EA2 and EA3 may be the same as one another. For example, in the display device 10, the first emission area EA1, the second emission area EA2 and the third emission area EA3 may have the same planar area, but the present disclosure is not limited thereto. In the display device 10, the planar areas or sizes of the first to third emission areas EA1, EA2 and EA3 may be different from one another. For example, the planar area of the second emission area EA2 may be greater than that of each of the first emission area EA1 and the third emission area EA3, and the planar area of the third emission area EA3 may be greater than that of the first emission area EA1. The intensity of light emitted from the corresponding emission areas EA1, EA2 and EA3 may vary depending on the planar area of each of the emission areas EA1, EA2 and EA3, and the planar area of each of the emission areas EA1, EA2 and EA3 may be adjusted to control a color of an image displayed at a display screen of the display device 10 or the electronic device 1. In the embodiment of FIG. 5, the planar areas of the emission areas EA1, EA2 and EA3 are the same as one another, but are not limited thereto.

In the display device 10, one first emission area EA1, one second emission area EA2 and one third emission area EA3, which are disposed to be adjacent to one another, may form one pixel group. One pixel group may include a group of emission areas (e.g., emission areas EA1, EA2 and EA3, for example) that emit light of different colors from each other to express a white gray scale, but is not limited thereto. Various modifications may be made in combining the emission areas EA1, EA2 and EA3 constituting one pixel group depending on the arrangement of the emission areas EA1, EA2 and EA3 and a color of light variously emitted from each of the emission areas EA1, EA2 and EA3.

The display device 10 may include a plurality of light emitting elements ED1, ED2 and ED3 disposed in their respective emission areas EA1, EA2 and EA3 different from one another. The light emitting elements ED1, ED2 and ED3 may include a first light emitting element ED1 disposed in the first emission area EA1, a second light emitting element ED2 disposed in the second emission area EA2 and a third light emitting element ED3 disposed in the third emission area EA3. The light emitting elements ED1, ED2 and ED3 include pixel electrodes AE1, AE2 and AE3, light emitting layers EL1, EL2 and EL3 and common electrodes CE1, CE2 and CE3. The light emitting elements ED1, ED2 and ED3 disposed in different emission areas EA1, EA2 and EA3 may emit light of different colors from each other depending on materials of the light emitting layers EL1, EL2 and EL3.

In an embodiment, for example, the first light emitting element ED1 disposed in the first emission area EA1 may emit red light of a first color having a peak wavelength in the range of about 610 nanometers (nm) to about 650 nm, the second light emitting element ED2 disposed in the second emission area EA2 may emit green light of a second color having a peak wavelength in the range of about 510 nm to about 550 nm, and the third light emitting element ED3 disposed in the third emission area EA3 may emit blue light of a third color having a peak wavelength in the range of about 440 nm to about 480 nm. The first to third emission areas EA1, EA2 and EA3 constituting one pixel PX may include light emitting elements ED1, ED2 and ED3 emitting light of different colors, thereby expressing a white gray scale.

The pixel electrodes AE1, AE2 and AE3 may be disposed on the second passivation layer PAS2. The pixel electrodes AE1, AE2 and AE3 may be respectively disposed in the plurality of emission areas EA1, EA2 and EA3. The pixel electrodes AE1, AE2 and AE3 may include a first pixel electrode AE1 disposed in the first emission area EA1, a second pixel electrode AE2 disposed in the second emission area EA2 and a third pixel electrode AE3 disposed in the third emission area EA3. The first pixel electrode AE1, the second pixel electrode AE2 and the third pixel electrode AE3 may be spaced apart from one another in a direction along the second passivation layer PAS2. In FIG. 5, the first to third pixels AE1, AE2 and AE3 are illustrated to be spaced apart in a fourth direction DR4. The fourth direction DR4 is any one direction on a plane defined by the first direction DR1 and second direction DR2 crossing each other. The pixel electrodes AE1, AE2 and AE3 may be respectively disposed in different emission areas EA1, EA2 and EA3 to constitute the light emitting elements ED1, ED2 and ED3 emitting light of different colors.

The pixel electrodes AE1, AE2 and AE3 may be electrically connected to the drain electrodes DE of the thin film transistors TFT, respectively, through a connection electrode including the first and second connection electrodes CNE1 and CNE2. The first to third pixel electrodes AE1, AE2 and AE3 may be insulated from each other by an inorganic insulating layer IL. For example, the first to third pixel electrodes AE1, AE2 and AE3 may include at least one of silver (Ag), copper (Cu), aluminum (Al), nickel (Ni) and lanthanum (La). For another example, the first to third pixel electrodes AE1, AE2 and AE3 may include a material such as indium tin oxide (ITO), indium zinc oxide (IZO), or indium tin zinc oxide (ITZO). For another example, the first to third pixel electrodes AE1, AE2 and AE3 may have a stacked structure of ITO/Ag/ITO/, ITO/Ag/IZO, or ITO/Ag/ITZO/IZO.

The inorganic insulating layer IL may be disposed on the second passivation layer PAS2, the residual pattern RP, and the pixel electrodes AE1, AE2 and AE3. The inorganic insulating layer IL may cover side surfaces and edges of the top surfaces of the first to third pixel electrodes AE1, AE2 and AE3 and the residual pattern RP. The inorganic insulating layer IL may be entirely disposed on the second passivation layer PAS2, that is, on an entirety of the second passivation layer PAS2. The inorganic insulating layer IL may partially expose the upper surfaces of the first to third pixel electrodes AE1, AE2 and AE3 to outside the inorganic insulating layer IL, to define emission areas EA1, EA2 and EA3.

Respective sidewalls of the inorganic insulating layer IL may define an opening therein, where the opening has a dimension along the fourth direction DR4. For example, the inorganic insulating layer IL may expose the first pixel electrode AE1 in the first emission area EA1, and the first light emitting layer EL1 may be directly disposed on the first pixel electrode AE1. The inorganic insulating layer IL may include an inorganic insulating material. For example, the inorganic insulating layer IL may include at least one of a silicon nitride layer, a silicon oxynitride layer, a silicon oxide layer, a titanium oxide layer, an aluminum oxide layer, a tantalum oxide layer, a hafnium oxide layer, a zinc oxide layer, and an amorphous silicon layer, but is not limited thereto.

According to an embodiment, the inorganic insulating layer IL is disposed on the pixel electrodes AE1, AE2 and AE3, and may be spaced apart from the upper surfaces of the pixel electrodes AE1, AE2 and AE3, along the thickness direction. Within a respective light emission area, for example, the inorganic insulating layer IL may partially overlap the pixel electrodes AE1, AE2 and AE3 in the thickness direction DR3 and may not be directly in contact with the pixel electrodes AE1, AE2 and AE3, and a portion of the light emitting layers EL1, EL2 and EL3 of the light emitting elements ED1, ED2 and ED3 and the residual pattern RP may be disposed between the inorganic insulating layer IL and the pixel electrodes AE1, AE2 and AE3. However, the inorganic insulating layer IL may be directly in contact with sides of the pixel electrodes AE1, AE2 and AE3. Outside of the respective light emission area, for example, the inorganic insulating layer IL may be directly in contact with sides of a respective pixel electrode.

Each of the inorganic insulating layer IL and the respective bank layers may include a side surface closest to a light emitting element ED and defining an opening. In the fourth direction DR4, a side surface of the inorganic insulating layer IL may protrude further than the side surface of the third bank layer BN3 and the side surface of the residual pattern RP. The side surface of the inorganic insulating layer IL may be further toward the light emitting element ED than all of the side surfaces of the bank structure BNS.

The residual pattern RP may be disposed at edges of each of the first to third pixel electrodes AE1, AE2 and AE3. The inorganic insulating layer IL may not be in direct contact with the top surface of each of the first to third pixel electrodes AE1, AE2 and AE3, due to the residual pattern RP disposed therebetween. In a process of manufacturing or providing of the display device 10, the residual pattern RP may be formed by removing a portion of a sacrificial layer SFL (see FIG. 7) disposed on the first to third pixel electrodes AE1, AE2 and AE3. The residual pattern RP may include an oxide semiconductor. For example, the residual pattern RP may include zinc (Zn), and in an embodiment, zinc indium-tin oxide (ZITO), indium gallium zinc oxide (IGZO), indium tin oxide (IZO) and zinc tin oxide (ZTO).

The light emitting layers EL1, EL2 and EL3 may be disposed on the pixel electrodes AE1, AE2 and AE3. The light emitting layers EL1, EL2 and EL3 may be organic light emitting layers made of an organic material, and may be formed on the pixel electrodes AE1, AE2 and AE3 through a deposition process. When the thin film transistor TFT respectively applies a predetermined voltage of the pixel electrodes AE1, AE2 and AE3 of the light emitting elements ED1, ED2 and ED3 and the common electrodes CE1, CE2 and CE3 of the light emitting elements ED1, ED2 and ED3 receive a common voltage or a cathode voltage, holes and electrons may be transferred to the light emitting layers EL1, EL2 and EL3 through the hole transporting layer and the electron transporting layer, and may be combined with each other in the light emitting layers EL1, EL2 and EL3 to emit light.

The light emitting layers EL1, EL2 and EL3 may include a first light emitting layer EL1, a second light emitting layer EL2 and a third light emitting layer EL3, which are respectively disposed in different emission areas EA1, EA2 and EA3. The first light emitting layer EL1 may be disposed on the first pixel electrode AE1 in the first emission area EA1, the second light emitting layer EL2 may be disposed on the second pixel electrode AE2 in the second emission area EA2, and the third light emitting layer EL3 may be disposed on the third pixel electrode AE3 in the third emission area EA3. The first to third light emitting layers EL1, EL2 and EL3 may be light emitting layers of the first to third light emitting elements ED1, ED2 and ED3, respectively. The first light emitting layer EL1 may be a light emitting layer emitting red light of a first color, the second light emitting layer EL2 may be a light emitting layer emitting green light of a second color, and the third light emitting layer EL3 may be a light emitting layer emitting blue light of a third color.

According to an embodiment, a portion of the light emitting layers EL1, EL2 and EL3 of the light emitting elements ED1, ED2 and ED3 may be disposed between the pixel electrodes AE1, AE2 and AE3, and the inorganic insulating layer IL, respectively. The deposition process of providing the light emitting layers EL1, EL2 and EL3 may be performed such that a material of the light emitting layer is deposited in an inclined direction that is not perpendicular or normal to the upper surface of the substrate SUB which is closest to the light emitting element layer EML. Therefore, a material of the light emitting layers EL1, EL2 and EL3 may be disposed to cover the upper surfaces of the pixel electrodes AE1, AE2 and AE3 exposed at the openings in the inorganic insulating layer IL and the residual pattern layer, and effectively fill the space between the pixel electrodes AE1, AE2 and AE3, and the inorganic insulating layer IL, respectively. Here, at the first emission area EA1, for example, the residual pattern RP is coplanar with the inorganic insulating layer IL and includes a side surface exposed to the space between the first pixel electrode AE1 and the inorganic insulating layer IL.

The common electrodes CE1, CE2 and CE3 may be disposed on the light emitting layers EL1, EL2 and EL3. The common electrodes CE1, CE2 and CE3 may include a transparent conductive material to transmit light generated from the light emitting layers EL1, EL2 and EL3. The common electrodes CE1, CE2 and CE3 may receive a common voltage or a low potential voltage. When the pixel electrodes AE1, AE2 and AE3 receive a voltage corresponding to the data voltage and the common electrodes CE1, CE2 and CE3 receive the low potential voltage, a potential difference is formed between the pixel electrodes AE1, AE2 and AE3 and the common electrodes CE1, CE2 and CE3, so that the light emitting layers EL1, EL2 and EL3 may emit light.

The common electrodes CE1, CE2 and CE3 may include a first common electrode CE1, a second common electrode CE2 and a third common electrode CE3, which are respectively disposed in the different emission areas EA1, EA2 and EA3. The first common electrode CE1 may be disposed on the first light emitting layer EL1 in the first emission area EA1, the second common electrode CE2 may be disposed on the second light emitting layer EL2 in the second emission area EA2, and the third common electrode CE3 may be disposed on the third light emitting layer EL3 in the third emission area EA3.

Similar to the light emitting layers EL1, EL2 and EL3, the common electrodes CE1, CE2 and CE3 may also be formed through a deposition process. The deposition process of the common electrodes CE1, CE2 and CE3 may be performed so that electrode materials are deposited in a direction inclined with respect to the upper surface of the substrate SUB rather than the direction perpendicular to the upper surface of the substrate SUB.

The capping layers CAP may be disposed on the common electrodes CE1, CE2 and CE3. The capping layers CAP may include an inorganic insulating material to cover the light emitting elements ED1, ED2 and ED3 and patterns disposed on the bank structure BNS. The capping layers CAP may prevent damage to the light emitting elements ED1, ED2 and ED3 from external air and prevent the patterns disposed on the bank structure BNS from being peeled off during the processes of manufacturing or providing the display device 10. In an embodiment, the capping layer CAP may include aluminum oxide, titanium oxide, tantalum oxide, hafnium oxide, zinc oxide, silicon oxide, silicon nitride, and/or silicon oxynitride.

The display device 10 may include a plurality of bank structures BNS disposed on the inorganic insulating layer IL. The bank structure BNS may have a structure in which bank layers BN1, BN2 and BN3 including different materials are sequentially stacked, may define the plurality of openings including or aligned with planar areas of the emission areas EA1, EA2 and EA3, and may be disposed so as to overlap a light shielding layer BM to be described later. The light emitting elements ED1, ED2 and ED3 of the display device 10 may be disposed to overlap the bank openings of the bank structure BNS.

The bank structure BNS may include a first bank layer BN1 disposed on the inorganic insulating layer IL, a second bank layer BN2 disposed on the first bank layer BN1, and a third bank layer BN3 disposed on the second bank layer BN2. That is, the first bank layer BN1, the second bank layer BN2 and the third bank layer BN3 are in order from the inorganic insulating layer IL.

The first bank layer BN1 may be disposed on the inorganic insulating layer IL and include zinc (Zn). When the first bank layer BN1 does not contain zinc (Zn) and is formed of a silicon-containing layer such as silicon nitride, silicon oxide, or silicon oxynitride, the first bank layer BN1 may be locally removed or damaged in the dry etching process of the second bank layer BN2 and the third bank layer BN3. Due to local damage to the first bank layer BN1, the sacrificial layer SFL and the pixel electrodes AE1, AE2 and AE3 may be damaged in the wet etching process for forming the undercut structure of the second bank layer BN2. Also, in the dry etching process for removing the first bank layer BN1, metal elements of the pixel electrodes AE1, AE2 and AE3 may be eluted.

When the first bank layer BN1 includes zinc (Zn), the first bank layer BN1 is not etched in the dry etching process of the second bank layer BN2 and the third bank layer BN3, and thus the sacrificial layer SFL and the pixel electrodes AE1, AE2 and AE3 may be protected. In addition, in the wet etching process for forming the undercut structure of the second bank layer BN2, the etching rate in respect to the etchant is low, and the sacrificial layer SFL and the pixel electrodes AE1, AE2 and AE3 may be protected. In addition, since the first bank layer BN1 including zinc (Zn) can be etched together with the sacrificial layer SFL, the number of masks can be reduced compared to the case where the first bank layer BN1 is etched separately.

According to an embodiment, the first bank layer BN1 may include zinc (Zn) and indium (In). In an embodiment, the first bank layer BN1 may include at least one or more of amorphous zinc indium tin oxide (ZITO), indium gallium zinc oxide (IGZO), and indium tin oxide (IZO). When the first bank layer BN1 includes zinc (Zn) and indium (In), since the element volatilization temperature is high, the second and third bank layers BN2 and BN3 may not be etched during the dry etching process and the lower pixel electrodes AE1, AE2 and AE3 and the sacrificial layer SFL may be protected. In addition, since the amorphous property can be maintained even at a high temperature, the first bank layer BN1 may maintain the amorphous property even after the deposition process of the second bank layer BN2 and the third bank layer BN3, and may be etched together with the sacrificial layer SFL.

According to an embodiment, the first bank layer BN1 may include amorphous zinc indium tin oxide (ZITO), and the ratio of tin (Sn) included in the first bank layer BN1 to the total number of atoms is about 14 atomic percent (at %) to about 22 at %. According to an example, the ratio of tin (Sn) included in the first bank layer BN1 may be about 18 at % to about 20 at %. When the ratio of tin (Sn) is within one or more of the above range, the selectivity for an etchant (e.g., an alkaline etchant or a fluorine-based etchant) used in the wet etching process for forming the undercut structure of the second bank layer BN2 is high, and the first bank layer BN1 is hardly damaged in the wet etching process. However, when the ratio of tin (Sn) to the total number of atoms is less than about 14 at %, the etching rate increases and the selectivity decreases. When the proportion of tin (Sn) to the total number of atoms is greater than about 22 at %, it is difficult to control the particle characteristics.

According to an embodiment, the atomic number ratio of zinc (Zn) and indium (In) included in the first bank layer BN1 may be about 1:1. When the ratio of zinc (Zn) to indium (In) satisfies the above range, the amorphous property of the first bank layer BN1 may be maintained. In respect to the 1:1 range, numerical values within the error range that can be predicted by a person skilled in the art may also be included.

A side surface of the first bank layer BN1 is recessed compared to a side surface of a second bank layer BN2 which will be described later. The side surface of the first bank layer BN1 may be recessed in a direction opposite to a direction toward the emission areas EA1, EA2 and EA3, that is, in a direction away from a respective light emission area. When the sacrificial layer SFL is etched so that the inorganic insulating layer IL exposes the first pixel electrode AE1, a material of the second bank layer BN2 may not be etched and only a material of the first bank layer BN1 may be etched so that the first bank layer BN1 may have a recessed side surface compared to the second bank layer BN2 at the respective light emission area. The side surface of the first bank layer BN1 may also be recessed compared to the side surface of the inorganic insulating layer IL.

The side surface of the first bank layer BN1 may be in direct contact with the first light emitting layer EL1. The side surface of the first bank layer BN1 may not be in direct contact with the first common electrode CE1. The light emitting layers EL1, EL2 and EL3 may fill a space defined by the first bank layer BN1 which is recessed compared to the second bank layer BN2, together with the second bank layer BN2.

In an embodiment, the thickness of the first bank layer BN1 may range from about 50 angstroms (Å) to about 600 Å. According to an example, the thickness of the first bank layer BN1 may range from about 100 Å to about 500 Å. When the thickness of the first bank layer BN1 is within one or mover of the above ranges, an area where the common electrodes CE1, CE2 and CE3 are in contact with the second bank layer BN2 (e.g., a contact area) may be secured, while the first bank layer BN1 serves as a mask to protect the lower sacrificial layer SFL and the pixel electrodes AE1, AE2 and AE3 in the etching process.

The second bank layer BN2 may be disposed on the first bank layer BN1. In a direction toward the emission areas EA1, EA2 and EA3, the side surface of the second bank layer BN2 may protrude more than the side surface of the first bank layer BN1, and the side surface of the second bank layer BN2 may be more recessed than the side surface of the third bank layer BN3.

According to an embodiment, the second bank layer BN2 may include a metal material. The metal material of the second bank layer BN2 may be any of a number of materials that is removed together with the third bank layer BN3 by dry etching, but is capable of forming an undercut structure by showing an etching rate different from that of the third bank layer BN3 with respect to an alkali-based etchant or a fluorine-based etchant. The second bank layer BN2 may include aluminum (Al).

In an embodiment, a thickness of the second bank layer BN2 may be in the range of about 4,000 Å to about 10,000 Å. According to an example, the thickness of the second bank layer BN2 may be in the range of about 6,000 Å to about 8,000 Å. When the thickness of the first bank layer BN1 is in one or more of the above ranges, a material of the light emitting layers EL1, EL2 and EL3 and a material of the common electrodes CE1, CE2 and CE3 may be disconnected or separated from each other to be formed through deposition and etching processes rather than a mask process.

According to an embodiment, the common electrodes CE1, CE2 and CE3 may be in direct contact with the side surfaces of the second bank layer BN2. The common electrodes CE1, CE2 and CE3 of different light emitting elements ED1, ED2 and ED3 may be in direct contact with the second bank layer BN2, respectively. In an embodiment, the second bank layer BN2 may include the metal material, such that the common electrodes CE1, CE2 and CE3 may be electrically connected to each other through the second bank layer BN2.

According to an embodiment, the light emitting layers EL1, EL2 and EL3 may be in direct contact with the lower surface of the second bank layer BN2 which extended from the protruded side surface thereof. Since the side surface of the second bank layer BN2 protrudes more toward the emission areas EA1, EA2 and EA3 than the side surface of the first bank layer BN1, a portion of the lower surface of the second bank layer BN2 is exposed at the respective light emission area. The light emitting layers EL1, EL2 and EL3 may be in direct contact with a portion of the lower surface of the second bank layer BN2 while filling the space defined by the exposed portion of the lower surface.

The third bank layer BN3 may be disposed on the second bank layer BN2. A side surface of the third bank layer BN3 may include a tip TIP protruding more than the side surface of the second bank layer BN2, in a direction toward the emission areas EA1, EA2 and EA3. The tip TIP may be defined by the side surface of the third bank layer BN3, together with an exposed portion of the lower surface and a portion of the upper surface which faces the exposed portion of the lower surface, Hereinafter, the tip TIP disposed on one edge of the third bank layer BN3 in one direction DR4 is defined as a first tip TIP1, and the tip TIP disposed on the other edge in the one direction DR4 is defined as a second tip TIP2. The first tip TIP1 and the second tip TIP2 each define a side surface of the third bank layer BN3, at a respective bank opening. The other edge of the third bank layer BN3 in respect to the one direction DR4 may be the opposite side of the one edge of the third bank layer BN3.

The first tip TIP1 of the third bank layer BN3 may face the second tip TIP2 of the third bank layer BN3, across the bank opening. A portion of an upper surface of the third bank layer BN3 that is not covered by organic patterns ELP1 and ELP2 and the electrode patterns CEP1 and CEP2 to be described later and at which the third bank layer BN3 is exposed, may exist between the first tip TIP1 and the second tip TIP2 of the third bank layer BN3.

The side surfaces of the third bank layer BN3 have a shape in which they protrude more than the side surfaces of the second bank layer BN2 toward the opening or the pixel areas AE1, AE2 and AE3, and accordingly, undercut structures of the second bank layer BN2 may be formed under the tips TIP of the third bank layer BN3.

Shapes of the side surfaces of the second and third bank layers BN2 and BN3 may be structures formed due to a difference in etch rate in an etching process since the second bank layer BN2 and the third bank layer BN3 include the different materials having different etching rates from each other. According to an embodiment, the third bank layer BN3 may include a material having an etching rate slower than that of the second bank layer BN2, and the second bank layer BN2 may be further etched in the etching process, such that undercuts may be formed under the tips TIP of the third bank layer BN3. In an embodiment, the second bank layer BN2 may include aluminum (Al), and the third bank layer BN3 may include titanium (Ti).

In the process of manufacturing or providing the display device 10, a mask process is used in order to form the pixel defining layer forming the emission areas EA1, EA2 and EA3 with an organic material, or form the light emitting layers EL1, EL2 and EL3 of the light emitting elements ED1, ED2 and ED3 for each of the emission areas EA1, EA2 and EA3. The display device 10 may include a structure for mounting a mask in order to perform the mask process or have an unnecessarily large planar area of the non-display area NDA in order to control dispersion of material according to the mask process. In one or more embodiment, when such a mask process is minimized, an unnecessary structure for mounting the mask may be omitted from the display device 10, and the planar area of the non-display area NDA for controlling the dispersion may be minimized.

In the display device 10 according to an embodiment, the bank structure BNS includes the tips TIP protruding toward the opening or the pixel areas AE1, AE2 and AE3, and thus, the light emitting layers EL1, EL2 and EL3 and the common electrodes CE1, CE2 and CE3 may be formed through deposition and etching processes rather than the mask process. In addition, it is possible to form different layers individually in the different emission areas EA1, EA2 and EA3 even through the deposition process. For example, even though the light emitting layers EL1, EL2 and EL3 and the common electrodes CE1, CE2 and CE3 of the light emitting elements ED1, ED2 and ED3 are formed through a deposition process that does not use the mask, materials deposited by the tip TIP protruding toward the opening or the pixel electrodes AE1, AE2 and AE3 of the third bank layer BN3 may be disconnected from each other by the tips TIP of the bank structure BNS interposed therebetween. It is possible to form the different material layers individually in the different emission areas EA1, EA2 and EA3, through a process of forming a material layer on an entirety of an area the display device 10 and then etching and removing portions of the material layer located in unwanted areas. In the display device 10, through the deposition and etching processes without using the mask process, the different light emitting elements ED1, ED2 and ED3 may be formed for each of the emission areas EA1, EA2 and EA3, the unnecessary structural component may be omitted from the display device 10, and the area of the non-display area NDA may be minimized.

In an embodiment, a thickness of the third bank layer BN3 may be in the range of about 500 Å to about 3,000 Å. According to an example, the thickness of the third bank layer BN3 may be in the range of about 700 Å to about 2,500 Å. According to an example, the thickness of the third bank layer BN3 may be in the range of about 1,000 Å to about 2,000 Å. When the above range is satisfied, fine patterning can be smoothly performed while securing enough strength to maintain the shape of the tip TIP.

A width or protruded length of the tip TIP relative to the side surface of an underlying layer such as the second bank layer BN2, may be defined along the fourth direction DR4. That is, a distance between the side surface of the second bank layer BN2 and the side surface of the first bank layer BN1 is smaller than a distance between the side surface of the second bank layer BN2 and the side surface of the third bank layer BN3.

In an embodiment, the tip TIP of the third bank layer BN3 protruding from the second bank layer BN2 toward the opening or the pixel areas AE1, AE2 and AE3 may have a width of about 0.1 micrometer (μm) to about 1.0 μm. According to an example, the width of each of the first tip and second tip may be in the range of about 0.1 μm to about 0.7 μm. According to an example, the width of each of the first tip and second tip may be in the range of about 0.2 μm to about 0.6 μm. When one or more of the above ranges is satisfied, the light emitting layers EL1, EL2 and EL3 and the common electrodes CE1, CE2 and CE3 of the emission area are uniformly deposited in the opening, and a region in which the common electrodes CE1, CE2 and CE3 are in contact with the sidewall of the second bank layer BN2 can be secured.

The tips TIP of the third bank layer BN3 may overlap the common electrodes CE1, CE2 and CE3 in the thickness direction DR3 of the substrate. The first tip may overlap the first common electrode CE1 in the thickness direction DR3, and the second tip may overlap the second common electrode CE2 in the thickness direction DR3. In addition, the tips TIP of the third bank layer BN3 may overlap the light emitting layers EL1, EL2 and EL3 in the thickness direction DR3 of the substrate perpendicular to the substrate. In addition, the tips TIP of the third bank layer BN3 may overlap the first bank layer BN1 in the thickness direction DR3 of the substrate. The common electrodes CE1, CE2 and CE3 may be formed under lower surfaces of the tips TIP of the third bank layer BN3. A maximum distance from the substrate SUB to each of the common electrodes CE1, CE2 and CE3 may be smaller than a maximum distance from the substrate SUB to the second bank layer BN2.

Although not shown in the drawing, the light emitting layers EL1, EL2 and EL3 may be in direct contact with the sidewall of the second bank layer BN2. A contact area between the common electrodes CE1, CE2 and CE3 and the sidewall of the second bank layer BN2 may be greater than a contact area between the light emitting layers EL1, EL2 and EL3 and the sidewall of the second bank layer BN2. Each of the deposition processes of the common electrodes CE1, CE2 and CE3 and the light emitting layers EL1, EL2 and EL3 may be performed so that the materials of the common electrodes CE1, CE2 and CE3 and the light emitting layers EL1, EL2 and EL3 are deposited in the direction inclined with respect to the upper surface of the substrate SUB, and planar areas of the common electrodes CE1, CE2 and CE3 and the light emitting layers EL1, EL2 and EL3 disposed on the side surfaces of the second bank layer BN2 may change depending on an inclined angle.

In an embodiment, the deposition process of a material of the common electrodes CE1, CE2 and CE3 may be performed in a more inclined direction than the deposition process of a material of the light emitting layers EL1, EL2 and EL3. The common electrodes CE1, CE2 and CE3 may be disposed to have a greater planar area than the light emitting layers EL1, EL2 and EL3 along a plane of the sidewalls of the second bank layer BN2, or may be disposed up to a greater height on the sidewalls of the second bank layer BN2 than the light emitting layers EL1, EL2 and EL3, along the thickness direction DR3. In an embodiment, since the common electrodes CE1, CE2 and CE3 of the different light emitting elements ED1, ED2 and ED3 are electrically connected to each other through the second bank layer BN2, it may be advantageous that the common electrodes CE1, CE2 and CE3 are in contact with the second bank layer BN2 in a greater contact area relative to a planar area of the sidewall thereof.

According to an embodiment, the protrusion length of the second bank layer BN2 relative to the side surface of the first bank layer BN1, may be smaller than that of the third bank layer BN3. At this time, the protrusion length of the second bank layer BN2 refers to the protrusion length of the side surface of the second bank layer BN2 relative to the side surface of the first bank layer BN1, and the protrusion length of the third bank layer BN3 refers to the protrusion length of the side surface of the third bank layer BN3 relative to the side surface of the second bank layer BN2, that is, the width of the tip.

The display device 10 may include patterns based on the shape and deposition process of the bank structure BNS. These patterns may be formed simultaneously with the light emitting layers EL1, EL2 and EL3 and the common electrodes CE1, CE2 and CE3 of the light emitting elements ED1, ED2 and ED3, and may remain on the bank structure BNS.

The display device 10 according to an embodiment may include a plurality of organic patterns ELP1, ELP2 and ELP3 including the same materials as the light emitting layers EL1, EL2 and EL3, respectively, and disposed on the bank structure BNS. Since the light emitting layers EL1, EL2 and EL3 are formed through a process of depositing materials on the entire surface of the display device 10, materials forming the light emitting layers EL1, EL2 and EL3 may be deposited on the bank structure BNS as well as in the emission areas EA1, EA2 and EA3 of the bank structure BNS. Here, an organic pattern among the plurality of organic patterns ELP1, ELP2 and ELP3 and a light emitting pattern among the light emitting layers EL1, EL2 and EL3 may be in a same layer as each other. As being in a same layer, elements may be formed in a same process and/or include a same material as each other, elements may be respective portions of a same material layer, elements may be on a same layer by forming an interface with a same underlying or overlying layer, etc., without being limited thereto.

For example, the display device 10 may include organic patterns ELP1, ELP2 and ELP3 disposed above the bank structure BNS. The organic patterns ELP1, ELP2 and ELP3 may include a first organic pattern ELP1, a second organic pattern ELP2 and a third organic pattern ELP3, which are disposed on the third bank layer BN3 of the bank structure BNS.

The first organic pattern ELP1 may include the same material as the first light emitting layer EL1 of the first light emitting element ED1. The second organic pattern ELP2 may include the same material as the second light emitting layer EL2 of the second light emitting element ED2, and the third organic pattern ELP3 may include the same material as the third light emitting layer EL3 of the third light emitting element ED3. The organic patterns ELP1, ELP2 and ELP3 may be formed in the forming processes of the light emitting layers EL1, EL2 and EL3 including the same materials as the organic patterns ELP1, ELP2 and ELP3, respectively.

The first organic pattern ELP1, the second organic pattern ELP2, and the third organic pattern ELP3 may be directly disposed on the third bank layer BN3 of the bank structure BNS. The organic patterns ELP1, ELP2 and ELP3 may be formed in the same processes as the light emitting layers EL1, EL2 and EL3 including the same materials as the organic patterns ELP1, ELP2 and ELP3, respectively, and may be disposed adjacent to the emission areas EA1, EA2 and EA3 in which the respective light emitting layers EL1, EL2 and EL3 are disposed. For example, the first organic pattern ELP1 may be disposed on the third bank layer BN3 while surrounding the first emission area EA1 and/or the first opening. The second organic pattern ELP2 may be disposed on the third bank layer BN3 while surrounding the second emission area EA2 and/or the second opening, and the third organic pattern ELP3 may be disposed on the third bank layer BN3 while surrounding the third emission area EA3 and/or the third opening.

Such organic patterns ELP1, ELP2 and ELP3 may be material traces formed from a portion of the deposited materials which is disconnected from the light emitting layers EL1, EL2 and EL3 rather than being connected to the light emitting layers EL1, EL2 and EL3, owing to the tips TIP of the bank structure BNS. The light emitting layers EL1, EL2 and EL3 may be formed in the openings, and the organic patterns ELP1, ELP2 and ELP3 and the light emitting layers EL1, EL2 and EL3 may be disconnected from each other by the tips TIP of the bank structure BNS. The light emitting layers EL1, EL2 and EL3 are formed through the deposition process that does not use the mask, and accordingly, materials of the light emitting layers EL1, EL2 and EL3 may be formed on an entirety of a planar area of the bank structure BNS, and the organic patterns ELP1, ELP2 and ELP3 may be formed by subsequently patterning these traces around the emission areas EA1, EA2 and EA3 or the openings.

The display device 10 according to an embodiment may include a plurality of electrode patterns CEP1, CEP2 and CEP3 including the same materials as the common electrodes CE1, CE2 and CE3 and disposed on the bank structure BNS. Since the common electrodes CE1, CE2 and CE3 are formed through a process of depositing a material on the entire surface of the display device 10, the material forming the common electrodes CE1, CE2 and CE3 can also be deposited on the bank structure BNS as well as in the emission area.

The display device 10 may include electrode patterns CEP1, CEP2 and CEP3 disposed on the bank structure BNS. The electrode patterns CEP1, CEP2 and CEP3 may include a first electrode pattern CEP1, a second electrode pattern CEP2, and a third electrode pattern CEP3 disposed on the third bank layer BN3 of the bank structure BNS.

For example, the first electrode pattern CEP1, the second electrode pattern CEP2, and the third electrode pattern CEP3 may be directly disposed on the first organic pattern ELP1, the second organic pattern ELP2, and the third organic pattern ELP3, respectively. An arrangement relationship between the electrode patterns CEP1, CEP2 and CEP3 and the organic patterns ELP1, ELP2, and ELP3 may be the same as an arrangement relationship between the light emitting layers EL1, EL2 and EL3 and the common electrodes CE1, CE2 and CE3 of the light emitting elements ED1, ED2 and ED3. Such electrode patterns CEP1, CEP2 and CEP3 may be traces formed while the deposited materials are disconnected from the common electrodes CE1, CE2 and CE3 rather than being connected to the common electrodes CE1, CE2 and CE3 since the bank structure BNS includes the tips TIP. In the display device 10, the common electrodes CE1, CE2 and CE3 may be individually formed in different areas even in the deposition process that does not use the mask by the tips TIP of the bank structure BNS. As being individually formed, an element may have a discrete shape in a plan view, without being limited thereto.

The display device 10 may include capping patterns CLP disposed above the bank structure BNS. The capping patterns CLP may be directly disposed on the first electrode pattern CEP1, the second electrode pattern CEP2, and the third electrode pattern CEP3 disposed on the third bank layer BN3 of the bank structure BNS. An arrangement relationship between the capping patterns CLP and the electrode patterns CEP1, CEP2 and CEP3 may be the same as an arrangement relationship between the common electrodes CE1, CE2 and CE3 of the light emitting elements ED1, ED2 and ED3 and the capping layers CAP. Such capping pattern CLP may be a trace formed when the deposited material is disconnected from the capping layer CAP since the bank structure BNS includes the tip TIP.

The plurality of organic patterns ELP1, ELP2 and ELP3, the electrode patterns CEP1, CEP2 and CEP3, and the capping patterns CLP may be disposed on the bank structure BNS, and may be disposed to surround the emission areas EA1, EA2 and EA3 or the openings which are aligned with such emission areas. A stacked structure of the organic patterns ELP1, ELP2 and ELP3, the electrode patterns CEP1, CEP2 and CEP3, and the capping patterns CLP disposed around the emission areas EA1, EA2 and EA3 may be partially etched in the manufacturing processes of the display device 10, such that a planar shape thereof may be changed. Accordingly, portions of an upper surface of the third bank layer BN3 of the bank structure BNS may not be covered by the organic patterns ELP1, ELP2 and ELP3, the electrode patterns CEP1, CEP and CEP3, and the capping patterns CLP, and may be exposed outside of the patterned stacked structure.

The thin film encapsulation layer TFEL may be disposed on the light emitting elements ED1, ED2 and ED3 and the bank structure BNS, and may cover the plurality of light emitting elements ED1, ED2 and ED3 and the bank structure BNS. The thin film encapsulation layer TFEL may include at least one inorganic layer to prevent oxygen or moisture from being permeated into the light emitting element layer EML. The thin film encapsulation layer TFEL may include at least one organic layer to protect the light emitting element layer EML from particles such as dust.

In an embodiment, the thin film encapsulation layer TFEL may include a first encapsulation layer TFE1, a second encapsulation layer TFE2 and a third encapsulation layer TFE3, which are sequentially stacked. The first encapsulation layer TFE1 and the third encapsulation layer TFE3 may be inorganic encapsulation layers, and the second encapsulation layer TFE2 disposed therebetween may be an organic encapsulation layer.

Each of the first encapsulation layer TFE1 and the third encapsulation layer TFE3 may include one or more inorganic insulating materials. The inorganic insulating materials may include any one of silicon oxide, silicon nitride, and silicon oxynitride, and may include, for example, aluminum oxide, titanium oxide, tantalum oxide, hafnium oxide, zinc oxide, silicon oxide, silicon nitride and/or silicon oxynitride.

The second encapsulation layer TFE2 may include a polymer-based material. The polymer-based material may include an acrylic resin, an epoxy-based resin, polyimide and polyethylene. For example, the second encapsulation layer TFE2 may include an acrylic resin, for example, polymethyl methacrylate, polyacrylic acid, and the like. The second encapsulation layer TFE2 may be formed by curing a monomer or applying a polymer.

The first encapsulation layer TFE1 may be disposed on the light emitting elements ED1, ED2 and ED3, the plurality of patterns and the bank structure BNS. The first encapsulation layer TFE1 may include a first inorganic layer TL1, a second inorganic layer TL2 and a third inorganic layer TL3, which are disposed to correspond to the different light emission areas EA1, EA2 and EA3, respectively.

The first inorganic layer TL1, the second inorganic layer TL2 and the third inorganic layer TL3 may respectively include an inorganic insulating material to cover the light emitting elements ED1, ED2 and ED3. The first inorganic layer TL1, the second inorganic layer TL2 and the third inorganic layer TL3 may prevent the light emitting elements ED1, ED2 and ED3 from being damaged from the external air, and the patterns disposed on the bank structure BNS may be prevented from being delaminated during the fabricating process of the display device 10. In an embodiment, the first inorganic layer TL1, the second inorganic layer TL2 and the third inorganic layer TL3 may include aluminum oxide, titanium oxide, tantalum oxide, hafnium oxide, zinc oxide, silicon oxide, silicon nitride and/or silicon oxynitride.

The first inorganic layer TL1, the second inorganic layer TL2 and the third inorganic layer TL3 may be disposed to cover the organic patterns ELP1, ELP2 and ELP3, the electrode patterns CEP1, CEP2 and CEP3 and the capping pattern CLP. The first inorganic layer TL1, the second inorganic layer TL2 and the third inorganic layer TL3 may be formed by chemical vapor deposition (CVD), and thus may be formed to have a uniform thickness along a step difference of the layers that are deposited. For example, the first inorganic layer TL1, the second inorganic layer TL2 and the third inorganic layer TL3 may form a thin film even below the undercut due to the tip TIP of the bank structure BNS.

The first inorganic layer TL1 may be disposed on the first light emitting element ED1 and the first electrode pattern CEP1. The first inorganic layer TL1 may be disposed along the first light emitting element ED1, the capping layer CAP and the sidewall adjacent to the first common electrode CE1 of the second bank layer BN2 to cover the first light emitting element ED1, the capping layer CAP and the side surface adjacent to the first common electrode CE1 of the second bank layer BN2, and may be disposed to cover the first organic pattern ELP1, the first electrode pattern CEP1 and the capping pattern CLP. However, the first inorganic layer TL1 may be disposed only on the first opening and the bank structure BNS near the first opening without being overlapped with the second opening and the third opening.

That is, referring to FIGS. 5 and 6, for example, the first emission area EA1 may include a first organic material layer (EL1 and ELP1) defining the first light emitting layer EL1 and a first organic pattern ELP1 which is on the third bank layer BN3 and disconnected from the first light emitting layer EL1 at the first emission area EA1, a first electrode material layer (CE1 and CEP1) defining the first common electrode CE1 and a first electrode pattern CEP1 which is on the first organic pattern ELP1 and disconnected from the first common electrode CE1 at the first emission area EA1, and a first inorganic layer (TL1) which extends along each of the first common electrode CE1, the side surface of the second bank layer BN2, a lower surface of the third bank layer BN3 which extends from the side surface the second bank layer BN2, and an upper surface of the first electrode pattern.

Further to this, a second organic material layer (EL2 and ELP2) defines the second light emitting layer EL2 and a second organic pattern ELP2 which is on the third bank layer BN3 and disconnected from the second light emitting layer EL2 at the second emission area EA2, a second electrode material layer (CE2 and CEP2) defines the second common electrode CE2 and a second electrode pattern CEP2 which is on the second organic pattern ELP2 and disconnected from the second common electrode CE2 at the second emission area EA2. And a second inorganic layer TL2 which extends along each of the second common electrode CE2, the side surface of the second bank layer BN2, the lower surface of the third bank layer BN3 and an upper surface of the second electrode pattern CEP2. The first inorganic layer TL1 and the second inorganic layer TL2 are disconnected to define a space therebetween at which a portion of the third bank layer BN3 is exposed to outside the first inorganic layer TL1 and the second inorganic layer TL2.

The second inorganic layer TL2 may be disposed on the second light emitting element ED2 and the second electrode pattern CEP2. The second inorganic layer TL2 may be disposed along the second light emitting element ED2, the capping layer CAP and the sidewall adjacent to the second common electrode CE2 of the second bank layer BN2 to cover the second light emitting element ED2, the capping layer CAP and the sidewall adjacent to the second common electrode CE2 of the second bank layer BN2, and may be disposed to cover the second organic pattern ELP2, the second electrode pattern CEP2 and the capping pattern CLP. However, the second inorganic layer TL2 may be disposed only on the second opening and the bank structure BNS near the second opening without being overlapped with the first opening and the third opening.

The third inorganic layer TL3 may be disposed on the third light emitting element ED3 and the third electrode pattern CEP3. The third inorganic layer TL3 may be disposed along the third light emitting element ED3, the capping layer CAP and the sidewall adjacent to the third common electrode CE3 of the second bank layer BN2 to cover the third light emitting element ED3, the capping layer CAP and the sidewall adjacent to the third common electrode CE3 of the second bank layer BN2, and may be disposed to cover the third organic pattern ELP3, the third electrode pattern CEP3 and the capping pattern CLP. However, the third inorganic layer TL3 may be disposed only on the third opening and the bank structure BNS near the third opening without being overlapped with the first opening and the second opening.

The first inorganic layer TL1 may be formed after the first common electrode CE1 is formed, the second inorganic layer TL2 may be formed after the second common electrode CE2 is formed, and the third inorganic layer TL3 may be formed after the third common electrode CE3 is formed. Accordingly, the first to third inorganic layers TL1, TL2 and TL3 may be disposed to cover different electrode patterns CEP1, CEP2 and CEP3 and organic patterns ELP1, ELP2 and ELP3, respectively. Each of the first inorganic layer TL1, the second inorganic layer TL2, and the third inorganic layer TL3 may have a greater planar area than each of the openings of the bank structure BNS in plan view. That is, the patterns of first encapsulation layer TFE1 may extend out of the bank openings and in a direction away from a respective light emission area, to have the greater planar area.

The first inorganic layer TL1, the second inorganic layer TL2, and the third inorganic layer TL3 may be disposed to be spaced apart from each other on the bank structure BNS. Accordingly, portions of the third bank layer BN3 of the bank structure BNS may not overlap the inorganic layers TL1, TL2 and TL3, and portions of the upper surface of the third bank layer BN3 may be exposed outside of the first encapsulation layer TFE1 without being covered by the inorganic layers TL1, TL2 and TL3 in the spaces between the first to third inorganic layers. A exposed portion of the third bank layer BNL3 may be in direct contact with the second encapsulation layer TFE2 of the thin film encapsulation layer TFEL.

The light shielding layer BM may be disposed on the thin film encapsulation layer TFEL. The light shielding layer BM may include a plurality of holes OPT1, OPT2 OPT3 defined therein disposed to respectively overlap the emission areas EA1, EA2 and EA3. For example, the first hole OPT1 may be disposed to overlap the first emission area EA1. The second hole OPT2 may be disposed to overlap the second emission area EA2, and the third hole OPT3 may be disposed to overlap the third emission area EA3. An area or size of each of the holes OPT1, OPT2 and OPT3 may be greater than that of the emission areas EA1, EA2 and EA3. As the holes OPT1, OPT2 and OPT3 of the light shielding layer BM are formed to be greater than the emission areas EA1, EA2 and EA3, light emitted from the emission areas EA1, EA2 and EA3 may be visible to outside the display device 10, such as by a user, from not only the side of the display device 10 but also from the front surface of the display device 10.

The light shielding layer BM may include a light absorbing material. For example, the light shielding layer BM may include an inorganic black pigment or an organic black pigment. The inorganic black pigment may be carbon black, and the organic black pigment may include, but is not limited to, at least one of lactam black, perylene black and aniline black. The light shielding layer BM may prevent visible light from being permeated among the first to third light emission areas EA1, EA2 and EA3, thereby preventing a color mixture from occurring to improve a color reproduction rate of the display device 10.

The display device 10 may include a plurality of color filters CF disposed on the emission areas EA1, EA2 and EA3. The plurality of color filters CF may include a plurality of color filters CF1, CF2 and CF3 disposed to respectively correspond to the emission areas EA1, EA2 and EA3. For example, the color filters CF1, CF2 and CF3 may be disposed on the light shielding layer BM that includes a plurality of holes OPT1, OPT2 and OPT3 disposed to correspond to the emission areas EA1, EA2 and EA3. The holes of the light shielding layer BM may be formed to overlap the emission areas EA1, EA2 and EA3 or the openings of the bank structures BNS, and may form light output areas to which light emitted from the emission areas EA1, EA2 and EA3 is output. Each of the color filters CF1, CF2 and CF3 may have an area greater than that of the hole of the light shielding layer BM, and each of the color filters CF1, CF2 and CF3 may completely cover the light output area defined by the hole.

The color filters CF1, CF2 and CF3 may include a first color filter CF1, a second color filter CF2 and a third color filter CF3, which are respectively disposed to correspond to the different emission areas EA1, EA2 and EA3. The color filters CF1, CF2 and CF3 may include a colorant, such as a dye or a pigment, which absorbs light of a wavelength range other than light of a specific wavelength range, and may be disposed to correspond to a color of light emitted from each of the emission areas EA1, EA2 and EA3. For example, the first color filter CF1 may be a red color filter disposed to overlap the first emission area EA1, transmitting only the first light of a red color. The second color filter CF2 may be a green color filter disposed to overlap the second emission area EA2, transmitting only the second light of a green color. The third color filter CF3 may be a blue color filter disposed to overlap the third emission area EA3, transmitting only the third light of a blue color.

The plurality of color filters CF1, CF2 and CF3 may be spaced apart from one another on the light shielding layer BM. The color filters CF1, CF2 and CF3 may respectively cover the holes OPT1, OPT2 and OPT3 of the light shielding layer BM, and may have an area that is greater than that of the hole and spaced apart from the other color filters on the light shielding layer BM but is not limited thereto. The color filters CF1, CF2 and CF3 may be disposed to partially overlap other adjacent color filters CF1, CF2 and CF3. The different color filters CF1, CF2 and CF3 do not overlap the emission areas EA1, EA2 and EA3, and may overlap one another on the light shielding layer BM that will be described later. The display device 10 may reduce intensity of reflective light due to external light as the color filters CF1, CF2 and CF3 are disposed to overlap one another. Furthermore, a color sense of the reflective light due to the external light may be controlled by adjusting layouts, shapes, areas of the color filters CF1, CF2 and CF3 on the plan view.

An overcoat layer OC may be disposed on the color filters CF1, CF2 and CF3 to planarize upper ends of the color filters CF1, CF2 and CF3. The overcoat layer OC may be a colorless light-transmissive layer that does not have a color of a visible light band. For example, the overcoat layer OC may include a colorless light-transmissive organic material such as an acrylic resin.

Hereinafter, a process of fabricating (or providing) the display device 10 according to an embodiment of the present disclosure will be described with reference to the other drawings.

FIGS. 7 to 18 are cross-sectional views illustrating structures of a fabricating process of a display device 10 according to an embodiment. FIGS. 7 to 18 schematically illustrate a process of forming a bank structure BNS as a light emitting element layer EML of the display device 10, light emitting elements ED and a thin film encapsulation layer TFEL. Hereinafter, a process of forming each layer with respect to a fabricating process of the display device 10 will be omitted, and a formation order of each layer will be described.

Figure 7:
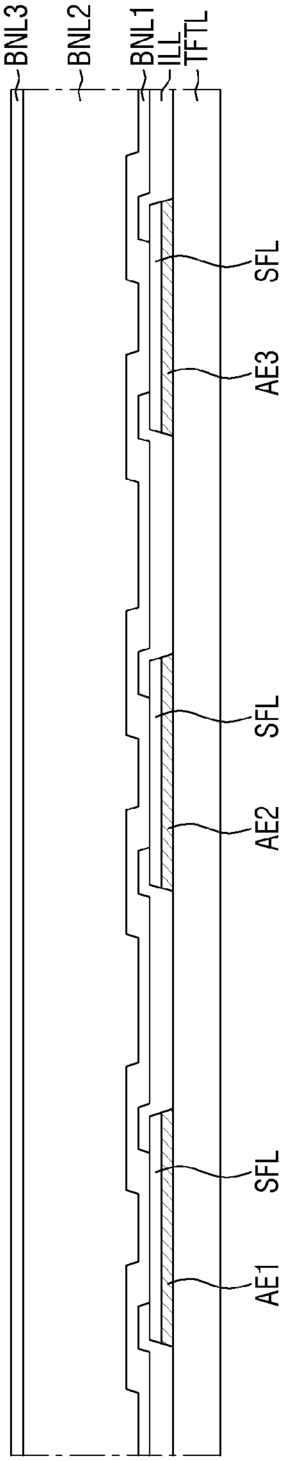
FIGS. 7 to 18 are cross-sectional views illustrating structures of a fabricating process of a display device according to an embodiment.

Referring to FIG. 7, a plurality of pixel electrodes AE1, AE2 and AE3 spaced apart from each other, sacrificial patterns SFL of a sacrificial layer (hereinafter sacrificial layer SFL) and a plurality of bank material layers BNL1, BNL2 and BNL3 as preliminary forms thereof, are formed (or provided) on a thin film transistor layer TFTL (see FIG. 3).

Although not shown in the drawing, the thin film transistor layer TFTL may be disposed on a substrate SUB, and a structure of the thin film transistor layer TFTL is the same as that described above with reference to FIG. 5. A detailed description of the thin film transistor layer TFTL will be omitted.

The sacrificial layer SFL may be disposed on the pixel electrodes AE1, AE2 and AE3. The sacrificial layer SFL may be disposed on the pixel electrodes AE1, AE2 and AE3, and a portion of each sacrificial layer may be removed in a subsequent process to form spaces or gaps in which the light emitting layers EL1, EL2 and EL3 are disposed. The sacrificial layer SFL may prevent the upper surfaces of the pixel electrodes AE1, AE2 and AE3 from being in contact with the inorganic insulating layer IL, and may be removed to form spaces or gaps between the pixel electrodes AE1, AE2 and AE3 and the inorganic insulating layer IL, respectively. In an embodiment, the sacrificial layer SFL may include an oxide semiconductor, and may include zinc (Zn). For example, the sacrificial layer SFL may include at least one of zinc indium tin oxide (ZITO), indium gallium zinc oxide (IGZO), zinc tin oxide (ZTO), and indium tin oxide (IZO).

An inorganic insulating material layer ILL as a preliminary inorganic insulating layer and bank material layers BNL1, BNL2 and BNL3 as preliminary bank layers, may be disposed on the sacrificial layer SFL. The inorganic insulating material layer ILL may be disposed to cover at least portion of the sacrificial layer SFL and the thin film transistor layer TFTL, and the first to third bank material layers BNL1, BNL2 and BNL3 may be disposed to entirely cover the inorganic insulating material layer ILL. The bank material layers BNL1, BNL2 and BNL3 may be partially etched in a subsequent process to respectively form bank layers BN1, BN2 and BN3 of the bank structures BNS illustrated in FIG. 5.

The first bank material layer BNL1 may include zinc (Zn). The first bank material layer BNL1 may include zinc indium tin oxide (ZITO), and the atomic ratio of tin (Sn) included in the first bank material layer BNL1 may be about 14 at % to about 22 at %.

Figure 8:
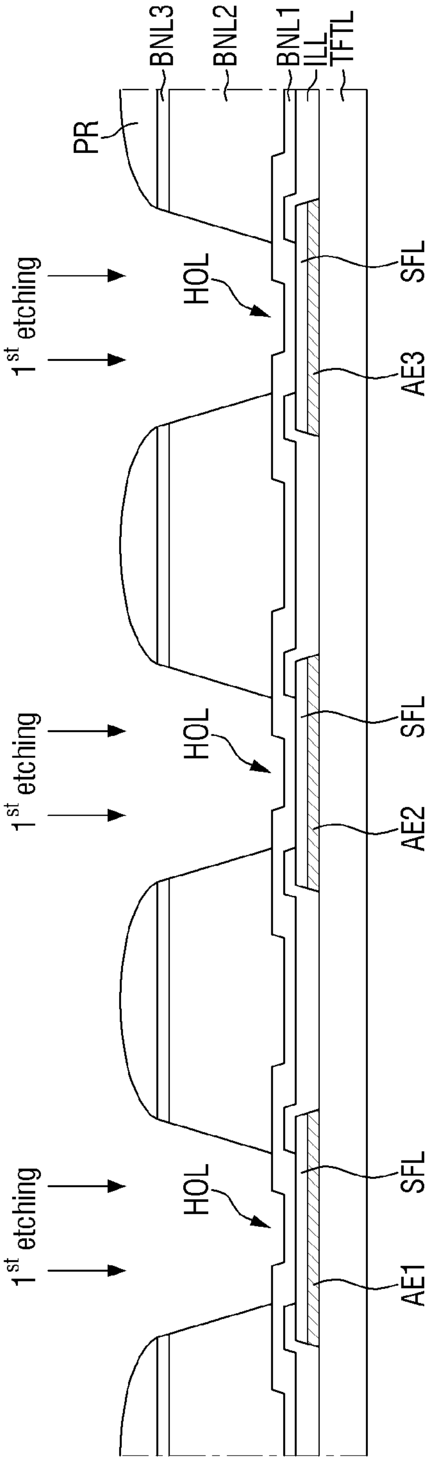

Next, referring to FIG. 8, a first photoresist PR is formed on the bank material layers BNL1, BNL2 and BNL3, and a first etching process is performed to etch a portion of the second and third bank material layers BNL2 and BNL3 using the first photoresist PR as a mask, to form a preliminary hole HOL.

The first-first photoresist PR may be disposed to be spaced apart from a second-first photoresist PR on bank material layers BNL1, BNL2 and BNL3. The first photoresists PR may be disposed to expose a portion overlapped or corresponding with the first to third pixel electrodes AE1 through AE3 on the third bank material layer BNL3.

In an embodiment, the first etching process may be performed by dry etching. As the first etching process is performed by dry etching, the second and third bank material layers BNL2 and BNL3 including different materials from each other may be anisotropically etched. In this process, the second and third bank material layers BNL2 and BNL3 may be etched together to partially expose the first bank material layer BNL1 to outside a remainder of the preliminary bank layer. The preliminary hole HOL may be formed in an area overlapped with the pixel electrodes AE1, AE2 and AE3, and may form a portion of the (bank) openings of the bank structure BNS.

Figure 9:
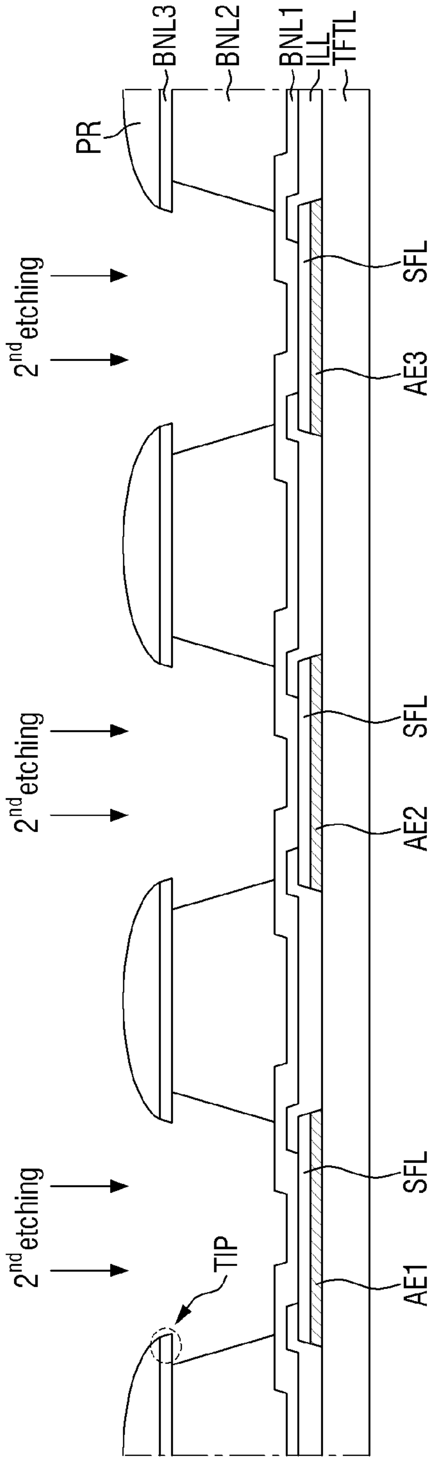

Then, referring to FIG. 9, in a second etching process, the etched portions of the second and third bank material layers BNL2 and BNL3 may be isotropically etched through wet etching at the preliminary hole HOL. The etching rate of the second bank material layer BNL2 may be higher than that of the other preliminary bank material layers, and the side surfaces of the third bank material layer BNL3 may be formed to protrude more than the side surfaces of the second bank material layer BNL2. The side surface of the third bank material layer BNL3 may protrude more than the side surface of the second bank material layer BNL2 toward the preliminary hole HOL to form a tip TIP, and an undercut may be formed therebelow.

Here, the first bank material layer BNL1 may remain unetched or minimally etched at the preliminary hole HOL such that a portion of the first bank material layer BNL1 covers the sacrificial layer SFL and the pixel electrode layer during the. In this process, the first bank material layer BNL1 may protect the lower sacrificial layers SFL and the pixel electrodes AE1, AE2 and AE3 and prevent damage.

Figure 10:
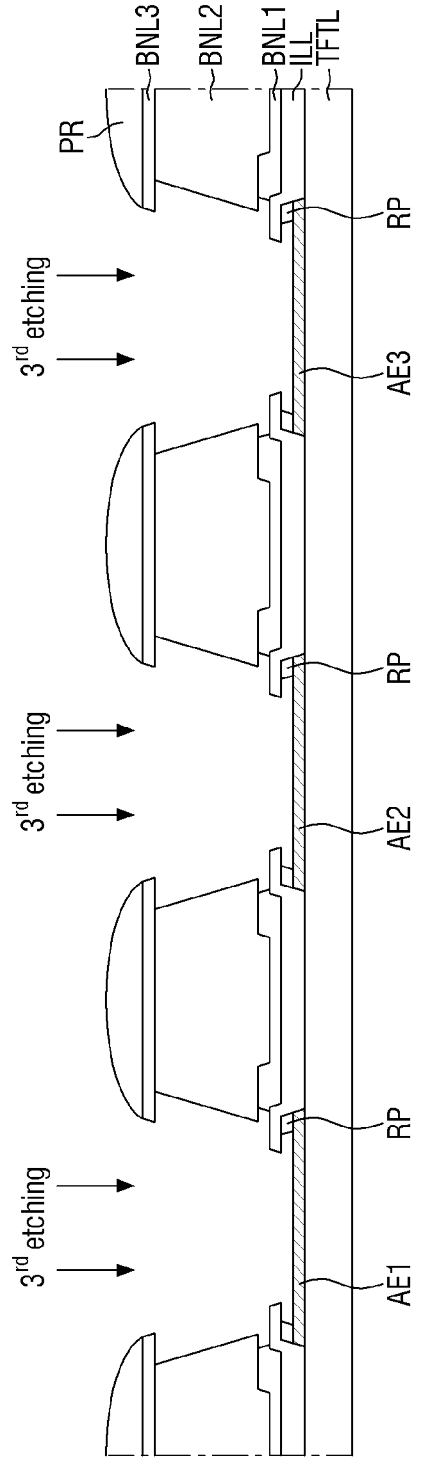

Next, referring to FIG. 10, a third etching process is performed to remove the covering portions of the first bank material layer BNL1, and the sacrificial layers SFL which are under the covering portions. In an embodiment, the sacrificial layer SFL may include an oxide semiconductor layer, and the third etching process may be performed by wet etching. In this process, portions of both the sacrificial layer SFL and the first bank material layer BNL1 which correspond to the various pixel electrodes may be isotropically etched.

A portion of the sacrificial layer SFL exposed at the preliminary hole HOL, and a portion of the sacrificial layer SFL between the protruding end portion of etched form of the first bank material layer BNL1 and the first pixel electrode AE1, may be removed. However, the sacrificial layer SFL may not be completely removed, and a portion of the sacrificial layer SFL may remain as the residual pattern RP between the etched form of the inorganic insulating material layer ILL and the first pixel electrode AE1. After a portion of the sacrificial layer SFL is removed to provide the residual pattern RP, a space (or volume) may be formed between the first pixel electrode AE1 and the protruding end portion of the etched form of the inorganic insulating material layer ILL disposed thereon. The space may be essentially bounded by the first pixel electrode AE1, the protruding end portion of the inorganic insulating material layer ILL and side surfaces of the residual pattern RP. In a subsequent process, the first light emitting layer EL1 disposed on the first pixel electrode AE1 may be formed to fill the space.

Since the first bank material layer BNL1 is etched while the inorganic insulating material layer ILL and the second bank material layer BNL2 are not etched at all (e.g., unetched) by the wet etching of the third etching process, a side surface of the first bank material layer BNL1 may be recessed relative to both a side surface of inorganic insulating material layer ILL and a side surface of the second bank material layer BNL2. A portion of the upper surface of the inorganic insulating material layer ILL and a portion of the lower surface of the second bank material layer BNL2 may be exposed at a position corresponding to the side surface of the first bank material layer BNL1. The area of the exposed upper surface of the inorganic insulating material layer ILL may be larger than the area of the exposed lower surface of the second bank material layer BNL2. The width of the exposed lower surface of the second bank material layer BNL2 in the fourth direction DR4 may be smaller than the width of the tip TIP of the third bank material layer BNL3 in the fourth direction DR4.

Figure 11:
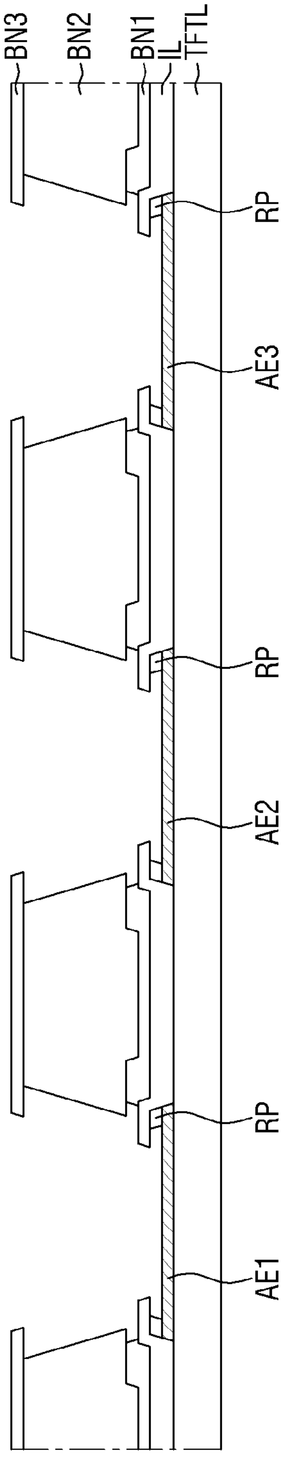

Subsequently, as shown in FIG. 11, the first photoresist PR is removed from the third bank layer BN3. Here, the inorganic insulating layer IL of the display device 10 is formed (see FIGS. 5 and 6) under respective bank structures, as respective portions of the inorganic insulating material layer ILL.

Figure 12:
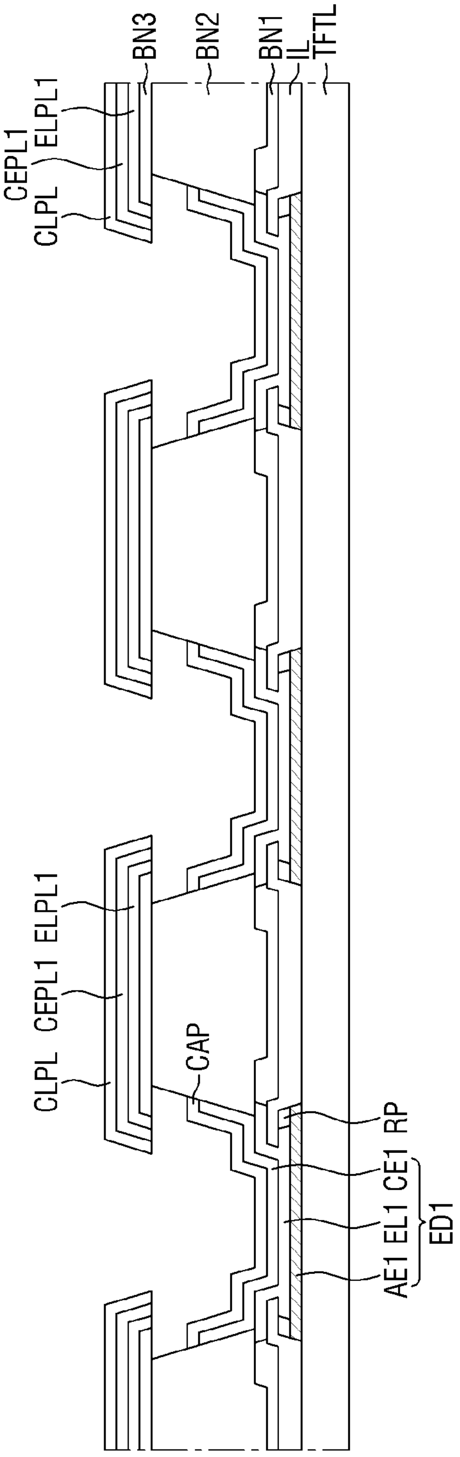

Next, referring to FIG. 12, the first light emitting layer EL1, the first common electrode CE1 and the capping layer CAP are deposited on the first pixel electrode AE1, and the first light emitting element ED1 is formed at the first emission area EA1. At this time, since material layers for respectively forming the first light emitting layer EL1, the first common electrode CE1, and the capping layer CAP are deposited on an entirety of a planar area the bank structure BNS, the first light emitting layer EL1, the first common electrode CE1, and the capping layer CAP are also formed in the opening overlapping not only the first pixel electrode AE1 but also the second pixel electrode AE2 and the third pixel electrode AE3. Materials forming the first light emitting layer EL1 and the first common electrode CE1 in the deposition process are also deposited on the third bank layer BN3 to form a plurality of patterns (traces) and a pattern material layer. For example, some of the materials may be deposited on the third bank layer BN3 to form a first organic pattern ELP1, a first electrode pattern CEP1, a first organic pattern material layer ELPL1 and a first electrode pattern material layer CEPL1. A portion of the capping layer CAP may be disposed in the first opening or in the first emission area EA1 to cover the first light emitting element ED1, and another portion of the capping layer CAP may be disposed on the third bank layer BN3 to cover the first organic pattern ELP1 and the first electrode pattern CEP1. A capping pattern material layer CLPL may be disposed on the third bank layer BN3 to cover the first organic pattern material layer ELPL1 and the first electrode pattern material layer CEPL1. The structure of the first light emitting layer EL1, the first common electrode CE1, the first organic pattern ELP1 and the first electrode pattern CEP1 is the same as that described above.

Meanwhile, the first light emitting layer EL1 and the first common electrode CE1 may be formed through a deposition process. The materials of the first opening may not be actively deposited due to the tip TIP of the third bank layer BN3. However, since the materials of the first light emitting layer EL1 and the first common electrode CE1 are deposited in an inclined direction that is not perpendicular to the upper surface of the substrate SUB, deposition may be performed even in an area covered by the tip TIP of the third bank layer BN3. The first light emitting layer EL1 may also be formed in a space in which the first bank layer BN1 is recessed.

For example, the deposition process for forming the first light emitting layer EL1 may be performed such that the materials are deposited in a direction that is not perpendicular to the upper surface of the first pixel electrode AE1, for example, in a direction inclined at a first angle. In an embodiment, the deposition of the material in the process of forming the light emitting layers EL1, EL2 and EL3 may be performed by being inclined at an angle of about 45 degrees (°) to about 50° relative to the upper surfaces of the pixel electrodes AE1, AE2 and AE3. The first light emitting layer EL1 may be formed to fill the space bounded by the first pixel electrode AE1, the residual pattern RP and the inorganic insulating layer IL, and the space bounded by the inorganic insulating layer IL, the first bank layer BN1 and the second bank layer BN2, and may be also extend into the area adjacent to the third bank layer BN3 which is covered by the tip TIP.

The deposition process of forming the first common electrode CE1 may be performed such that the materials are deposited in a direction that is not perpendicular to the upper surface of the first pixel electrode AE1, for example, in a direction inclined at a second angle. In an embodiment, the deposition of the material in the process of forming the common electrodes CE1, CE2 and CE3 may be performed by being inclined at an angle of about 30° or less relative to the upper surfaces of the pixel electrodes AE1, AE2 and AE3. The first common electrode CE1 may be disposed on the first light emitting layer EL1, and may be also formed in the area covered by the tip TIP of the third bank layer BN3. For example, the first common electrode CE1 is an area covered by the tip TIP, and may be partially disposed on the sidewall of the second bank layer BN2.

The deposition process of forming the common electrodes CE1, CE2 and CE3 may be performed by being inclined to be relatively closer to a horizontal direction than the deposition process of forming the light emitting layers EL1, EL2 and EL3, that is, at a smaller inclination angle. The second inclination angle at which materials are deposited for forming the common electrodes CE1, CE2 and CE3 may be smaller than the first inclination angle at which materials are deposited for forming the light emitting layers EL1, EL2 and EL3. Therefore, the common electrodes CE1, CE2 and CE3 may have a contact area with the sidewall of the second bank layer BN2, which is greater than that of the light emitting layers EL1, EL2 and EL3. Alternatively, the common electrodes CE1, CE2 and CE3 may be deposited to reach a higher position along the sidewall of the second bank layer BN2 than the light emitting layers EL1, EL2 and EL3 (e.g., along the thickness direction). In an embodiment, the different common electrodes CE1, CE2 and CE3 may be electrically connected to one another in contact with the second bank layer BN2 having high conductivity.

Figure 13:
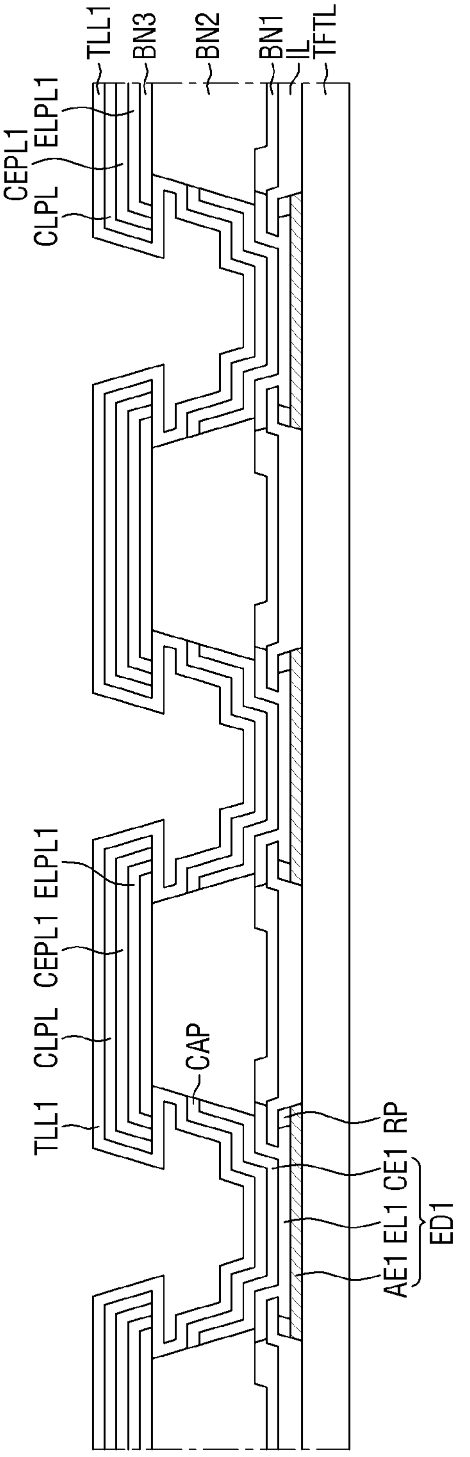

Next, referring to FIG. 13, a first inorganic material layer TLL1 covering the first light emitting element ED1 and the capping layer CAP is formed. Unlike the light emitting layers EL1, EL2 and EL3 and the common electrodes CE1, CE2 and CE3, the first inorganic material layer TLL1 may be performed through a chemical vapor deposition (CVD) process, and the first inorganic material layer TLL1 may form a uniform film regardless of the step difference of the deposited portion. The first inorganic material layer TLL1 may be formed to completely cover outer surfaces of the first light emitting element ED1, the bank layers BN1, BN2 and BN3, and the capping layers CAP, while being disposed in the aligned openings at the various emission areas, extending out of the aligned openings and along a top surface of the stacked structure. In particular, the first inorganic material layer TLL1 may also be deposited under the tip TIP of the third bank layer BN3.

Figure 14:
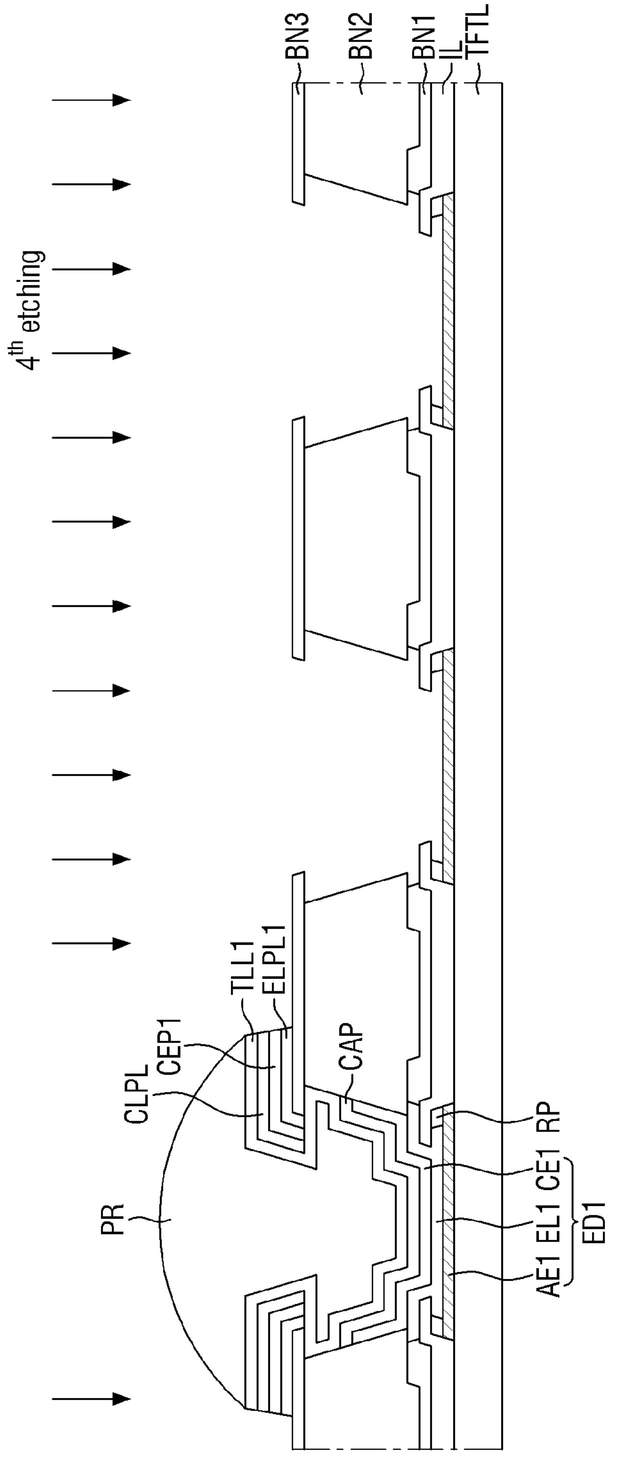

Next, referring to FIG. 14, a second photoresist PR having a mask pattern is formed on the first inorganic material layer TLL1 in a preliminary form, and the fourth etching process is performed to remove portions of the first organic pattern material layer ELPL1, the first electrode pattern material layer CEPL1, the capping pattern material layer CLPL, and the first inorganic material layer TLL1 that are not covered by the mask pattern and are respectively disposed on the bank material layers BNL1, BNL2 and BNL3.

In this process, the second photoresist PR may be disposed to overlap the first emission area EA1 and an edge area surrounding the first emission area EA1. The first organic pattern material layer ELPL1, the first electrode pattern material layer CEPL1, the capping pattern material layer CLPL, and the first inorganic material layer TLL1 disposed on the bank layers BN1, BN2 and BN3 may be removed except from the first emission area EA1 or from around the first light emitting element ED1. In this process, the area of the bank structure BNS and the area of lower layers except the first emission area EA1 or the periphery of the first light emitting element ED1 of the upper surface of the third bank layer BN3 may be exposed.

According to an embodiment, the fourth etching process for removing the first inorganic material layer TLL1 disposed on the bank layers BN1, BN2 and BN3 may be performed as a dry etching process. An etchant for not etching the third bank layer BN3 while removing the first inorganic material layer TLL1 not covered by the mask pattern may be used for the fourth etching process.

Figure 15:
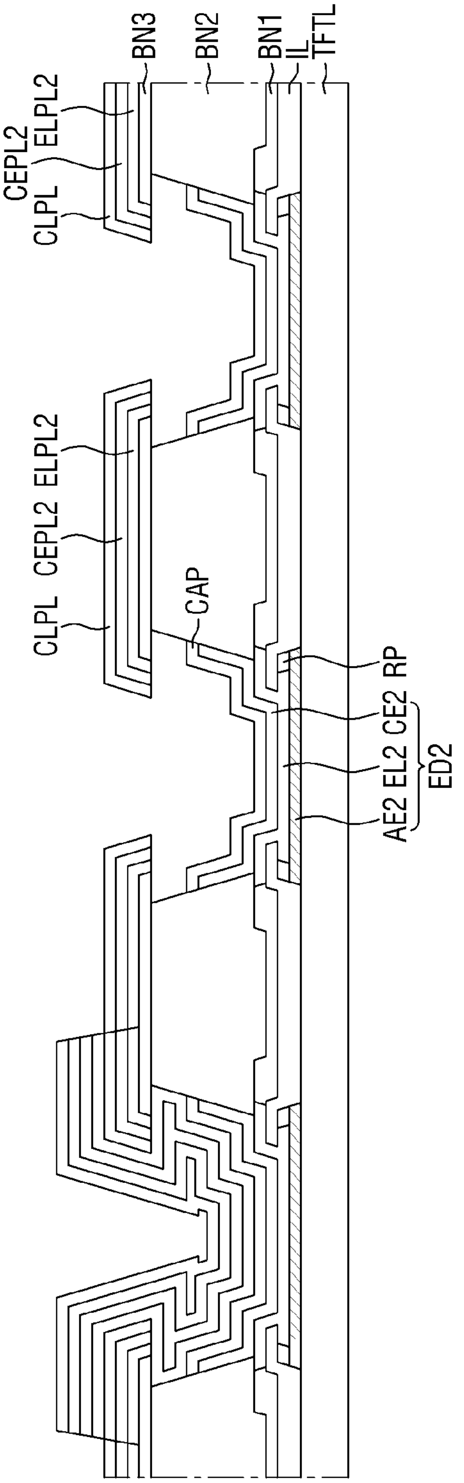

Next, referring to FIG. 15, the second photoresist PR disposed on the first emission area EA1 is removed to provide a first preliminary stacked structure at the first emission area EA1 including patterns TLL1 through AE1 inclusive. With the first preliminary stacked structure on the thin film transistor layer TFTL, a process similar to the above-described deposition process of the first light emitting layer EL1, the first common electrode CE1, the capping layer CAP, the first organic pattern ELP1, the first electrode pattern CEP1 and the capping pattern CLP is repeated to form the second light emitting layer EL2, the second common electrode CE2, the second organic pattern ELP2 and the second electrode pattern CEP2 at the second emission area EA2. At this time, the second light emitting layer EL2, the second common electrode CE2, and the capping layer CAP are deposited on the first light emitting element ED1 in the first emission area EA1. Here, material patterns of the second light emitting layer EL2, the second common electrode CE2, and the capping layer CAP may abut or be adjacent to the first organic pattern material layer ELPL1, the first electrode pattern material layer CEPL1, the capping pattern material layer CLPL on the bank structure BNS which is around the first emission area EA1.

Figure 16:
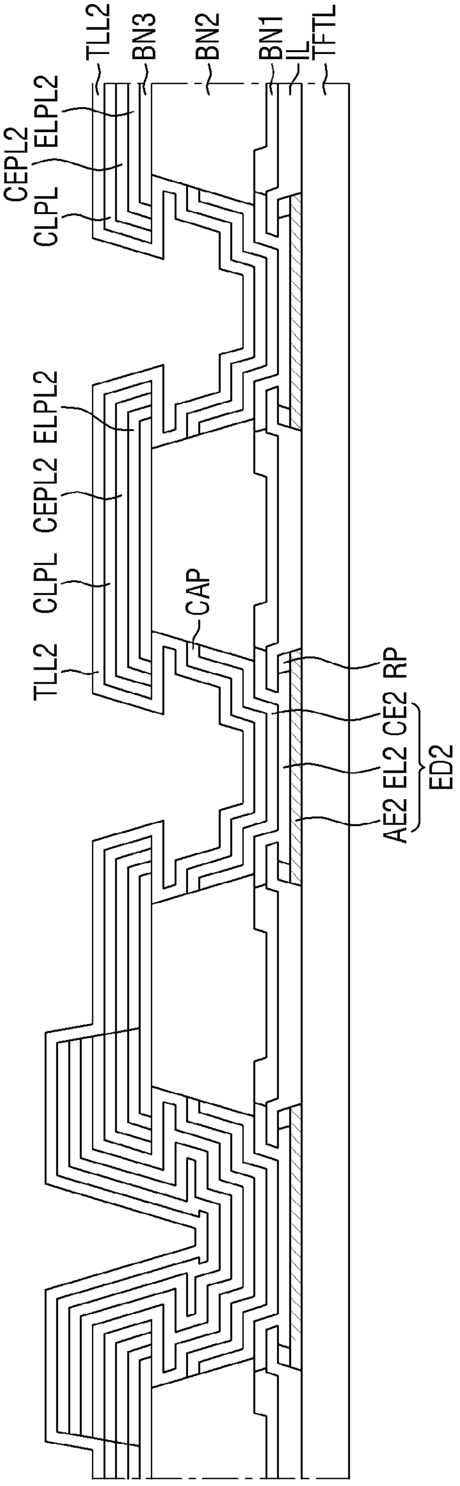

Next, referring to FIG. 16, similarly to the formation of the first inorganic material layer TLL1 in FIG. 13, a second inorganic material layer TLL2 covering the second light emitting element ED2 and the capping layer CAP is formed.

Figure 17:
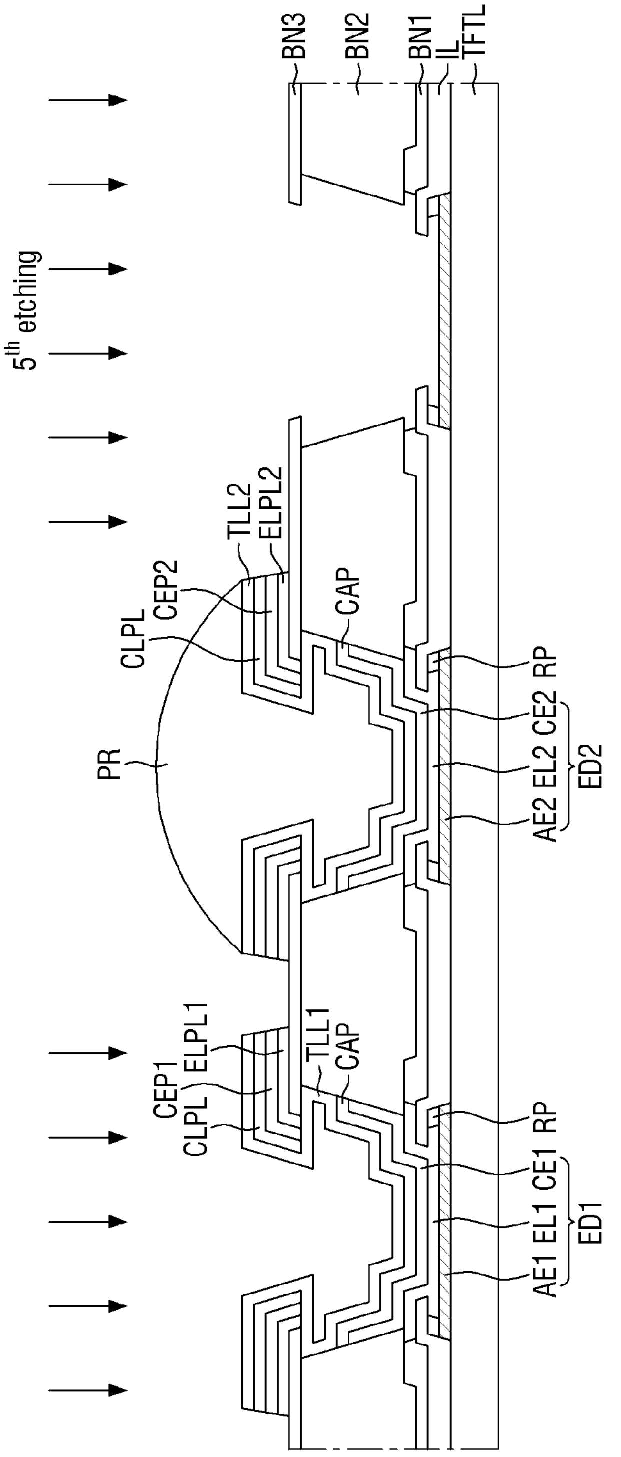

Referring to FIG. 17, a third photoresist PR having a mask pattern is formed on the second inorganic material layer TLL2 overlapping the second light emitting element ED2, and a fifth etching process is performed to remove the second organic pattern material layer ELPL2, the second electrode pattern material layer CEPL2, the capping pattern material layer CLPL, and the second inorganic material layer TLL2 not covered by the mask pattern (e.g., at various emission areas other than the second emission area EA2 and the region of the bank structure BNS which is closest to the second emission area EA2. At this time, the first light emitting element ED1, and the first organic pattern ELP1, the first electrode pattern CEP1, the capping pattern CLP, and the first inorganic layer TL1 near the first light emitting element ED1 may remain at the first emission area EA1 without being etched. A portion of the upper surface of the third bank layer BN3 which is between the first emission area EA1 and the second emission area EA2 may be exposed without being covered by the first organic pattern ELP1 and the second organic pattern ELP2.

Figure 18:
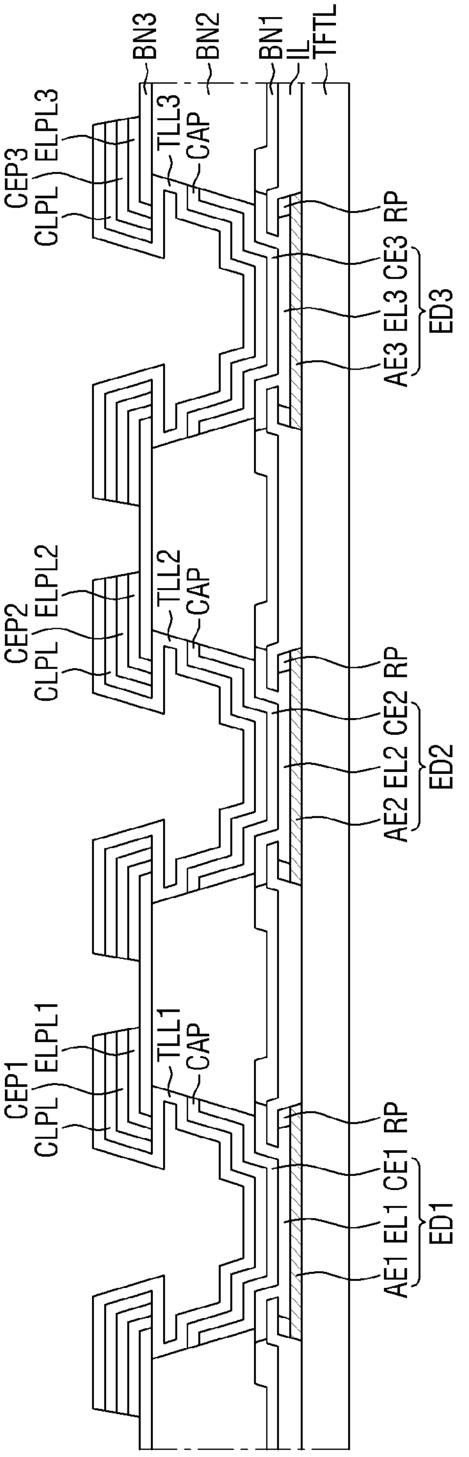

With the third photoresist PR of FIG. 17 removed, a second preliminary stacked structure may be provided on the thin film transistor layer TFTL, at both the first emission area EA1 and the second emission area EA2, including the layer of patterns TLL1 and TLL2 through the layer of patterns AE1 and AE2, inclusive Referring to FIG. 18, with the second preliminary stacked structure on the thin film transistor layer TFTL, processes similar to those described above may be repeated to form the third light emitting element ED3, the third organic pattern ELP3, the third electrode pattern CEP3, and the third inorganic layer TL3 at the third emission area EA3. Here, with a subsequent photoresist removed, a third preliminary stacked structure may be provided on the thin film transistor layer TFTL, at all of the respective emission areas, including the layer of patterns TLL1, TLL2 and TLL3 through the layer of patterns AE1, AE2 and AE3, inclusive.

Subsequently, although not shown, the display device 10 is completed by forming the light emitting elements ED1, ED2 and ED3 in the respective emission areas of the third preliminary stacked structure, and providing a second encapsulation layer TFE2 and a third encapsulation layer TFE3 of the thin film encapsulation layer TFEL, a light shielding layer BM, a color filter layer CFL and an overcoat layer OC on the bank structure BNS of the third preliminary stacked structure. The respective stacked structure of the thin film encapsulation layer TFEL, the light shielding layer BM, the color filter layer CFL and the overcoat layer OC is the same as that described above and thus a detailed description thereof will be omitted.

However, the effects of the present disclosure are not restricted to the one set forth herein. The above and other effects of the present disclosure will become more apparent to one of daily skill in the art to which the present disclosure pertains by referencing the claims.

What is claimed is:

1. A display device comprising: a first emission area including: a first pixel electrode; an inorganic insulating layer on the first pixel electrode and exposing the first pixel electrode to outside the inorganic insulating layer; a first light emitting layer on the first pixel electrode; and a first common electrode on the first light emitting layer; and a bank layer which is on the inorganic insulating layer and in which an opening is defined corresponding to the first emission area and exposing the first common electrode to outside the bank layer, the bank layer including: a first bank layer including zinc; a second bank layer on the first bank layer; a third bank layer on the second bank layer; each of the first bank layer, the second bank layer and the third bank layer including a side surface which defines a portion of the opening in the bank layer; the side surface of the first bank layer recessed from the side surface of the second bank layer in a direction away from the first emission area; and the side surface of the second bank layer recessed from the side surface of the first third bank layer in a direction away from the first emission area.

2. The display device of claim 1, wherein the side surface of the first bank layer is in contact with the first light emitting layer and is not in contact with the first common electrode.

3. The display device of claim 1, wherein the first bank layer includes at least one of zinc indium tin oxide, indium gallium zinc oxide and indium tin oxide.

4. The display device of claim 3, wherein the first bank layer includes zinc indium tin oxide, and a ratio of tin to a total number of atoms included in the first bank layer is about 14 atomic percent to about 22 atomic percent.

5. The display device of claim 1, wherein a distance between the side surface of the second bank layer and the side surface of the first bank layer is smaller than a distance between the side surface of the second bank layer and the side surface of the third bank layer.

6. The display device of claim 1, wherein the first bank layer has a thickness ranging from about 50 angstroms to about 600 angstroms.

7. The display device of claim 1, wherein the first common electrode contacts the side surface of the second bank layer.

8. The display device of claim 1, wherein within the first emission area, the inorganic insulating layer is spaced apart from the first pixel electrode to define a space therebetween, and the first light emitting layer is in the space between the first pixel electrode and the inorganic insulating layer.

9. The display device of claim 8, further comprising a residual pattern which is in the space between the inorganic insulating layer and the first pixel electrode and includes zinc.

10. The display device of claim 9, wherein the residual pattern includes at least one of zinc indium tin oxide, indium gallium zinc oxide, indium tin oxide and zinc tin oxide.

11. The display device of claim 9, wherein the residual pattern is coplanar with the inorganic insulating layer and includes a side surface exposed to the space between the first pixel electrode and the inorganic insulating layer, and the inorganic insulating layer protrudes further than the side surface of the third bank layer and the side surface of the residual pattern, in a direction towards the first emission area.

12. The display device of claim 1, wherein the second bank layer includes aluminum and has a thickness of about 4,000 angstroms to about 10,000 angstroms, and the third bank layer includes titanium and has a thickness of about 500 angstroms to about 3,000 angstroms.

13. The display device of claim 1, further comprising:

a first organic material layer defining the first light emitting layer and a first organic pattern which is on the third bank layer and disconnected from the first light emitting layer at the first emission area;

a first electrode material layer defining the first common electrode and a first electrode pattern which is on the first organic pattern and disconnected from the first common electrode at the first emission area; and a first inorganic layer which extends along each of the first common electrode, the side surface of the second bank layer, a lower surface of the third bank layer which extends from the side surface the second bank layer, and an upper surface of the first electrode pattern.

14. The display device of claim 13, further comprising:

a plurality of emission areas including the first emission area and a second emission area;

the second emission area including:

a second pixel electrode spaced apart from the first pixel electrode;

the inorganic insulating layer further on the second pixel electrode and exposing the second pixel electrode to outside the inorganic insulating layer;

a second light emitting layer on the second pixel electrode; and a second common electrode on the second light emitting layer and spaced apart from the first common electrode;

the bank layer further defining an opening therein corresponding to the second emission area and exposing the second common electrode to outside the bank layer;

a second organic material layer defining the second light emitting layer and a second organic pattern which is on the third bank layer and disconnected from the second light emitting layer at the second emission area;

a second electrode material layer defining the second common electrode and a second electrode pattern which is on the second organic pattern and disconnected from the second common electrode at the second emission area; and a second inorganic layer which extends along each of the second common electrode, the side surface of the second bank layer, the lower surface of the third bank layer and an upper surface of the second electrode pattern, wherein the first inorganic layer and the second inorganic layer are disconnected to define a space therebetween at which a portion of the third bank layer is exposed to outside the first inorganic layer and the second inorganic layer.

* * * * *